United States Patent
Antonyan

(10) Patent No.: US 11,342,036 B2
(45) Date of Patent: May 24, 2022

(54) MEMORY DEVICE FOR WRITE OPERATION INCLUDING VERIFICATION AND OPERATING METHOD THEREOF

(71) Applicant: SAMSUNG ELECTRONICS CO., LTD., Suwon-si (KR)

(72) Inventor: Artur Antonyan, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/025,689

(22) Filed: Sep. 18, 2020

(65) Prior Publication Data

US 2021/0319839 A1    Oct. 14, 2021

(30) Foreign Application Priority Data

Apr. 10, 2020    (KR) .................... 10-2020-0044310

(51) Int. Cl.
| | | |
|---|---|---|
| *G11C 16/34* | (2006.01) | |
| *G11C 16/28* | (2006.01) | |
| *G11C 7/06* | (2006.01) | |
| *G11C 16/30* | (2006.01) | |
| *G11C 16/08* | (2006.01) | |

(52) U.S. Cl.
CPC ............ *G11C 16/3459* (2013.01); *G11C 7/06* (2013.01); *G11C 16/08* (2013.01); *G11C 16/28* (2013.01); *G11C 16/30* (2013.01)

(58) Field of Classification Search
CPC ....... G11C 16/3459; G11C 16/30; G11C 7/06; G11C 16/28; G11C 16/08
See application file for complete search history.

(56) References Cited

U.S. PATENT DOCUMENTS

| | | |
|---|---|---|
| 7,095,648 B2 | 8/2006 | Ditewig et al. |
| 7,382,664 B2 | 6/2008 | Le Phan |
| 7,889,545 B2 | 2/2011 | Lee et al. |
| 8,711,609 B2 | 4/2014 | Lee |
| 8,902,633 B2 | 12/2014 | Lee et al. |
| 9,595,311 B2 | 3/2017 | Takizawa |
| 10,347,314 B2 | 7/2019 | Berger et al. |
| 10,360,948 B2 | 7/2019 | Antonyan |
| 10,446,210 B2 | 10/2019 | Berger et al. |

(Continued)

OTHER PUBLICATIONS

Hiroki Noguchi et al., "4Mb STT-MRAM-Based Cache with Memory-Access-Aware Power Optimization and Write-Verify-Write / Read-Modify-Write Scheme", ISSCC 2016, Session 7, Nonvolatile Memory Solutions, 7.2, 978-1-4673-9467-3/16, Feb. 2, 2016, pp. 132-133, 3 pages total.

*Primary Examiner* — Jay W. Radke

(74) *Attorney, Agent, or Firm* — Sughrue Mion, PLLC

(57) ABSTRACT

A memory device includes: a cell array including a memory cell and a reference cell; a sense amplifier configured to sense a difference between a first current flowing through the memory cell and a second current flowing through the reference cell, based on an activated sense enable signal; a controller configured to inactivate the sense enable signal in a program interval and activate the sense enable signal in a verify interval subsequent to the program interval, during a write operation; and a voltage driver configured to provide a write voltage to the memory cell in the program interval and the verify interval during the write operation, and to provide a read voltage to the memory cell during a read operation.

18 Claims, 14 Drawing Sheets

(56) References Cited

U.S. PATENT DOCUMENTS

| | | |
|---|---|---|
| 10,460,781 B2 | 10/2019 | Berger et al. |
| 2010/0067282 A1* | 3/2010 | Liu .................... G11C 11/1673 |
| | | 365/148 |
| 2010/0232206 A1* | 9/2010 | Li ....................... G11C 11/1677 |
| | | 365/148 |

* cited by examiner ature, and the like. Accord-

MEMORY DEVICE FOR WRITE OPERATION INCLUDING VERIFICATION AND OPERATING METHOD THEREOF

CROSS-REFERENCE TO RELATED APPLICATION

This application claims priority from Korean Patent Application No. 10-2020-0044310, filed on Apr. 10, 2020 in the Korean Intellectual Property Office, the disclosure of which is incorporated herein in its entirety by reference.

BACKGROUND

The inventive concept relates to a memory device, and more particularly, to a memory device for a write operation including verification and an operating method thereof.

A resistive memory device may store data in a memory cell including a variable resistance element. To write data in a memory cell, a write current and/or a write voltage may be provided to the memory cell, and a variable resistance element may have a resistance corresponding to the data by the write current and/or the write voltage. In addition, to read data stored in a memory cell, a read current and/or a read voltage may be provided to the memory cell, and a resistance of a variable resistance element corresponding to the data may be determined by detecting the read current and/or the read voltage. Data read and/or write in a resistive memory device may be sensitive to variation of at least one of a process, a voltage, a temperature, and the like. Accordingly, it may be significant to guarantee an operation reliability of the resistive memory device without decreasing the performance thereof.

SUMMARY

The inventive concept relates to a memory device and provides a memory device for efficiently performing a write operation including verification and an operating method thereof.

According to an aspect of an exemplary embodiment, there is provided a memory device including: a cell array including a memory cell and a reference cell; a sense amplifier configured to sense a difference between a first current flowing through the memory cell and a second current flowing through the reference cell, based on an activated sense enable signal; a controller configured to inactivate the sense enable signal in a program interval and activate the sense enable signal in a verify interval subsequent to the program interval, during a write operation; and a voltage driver configured to provide a write voltage to the memory cell in the program interval and the verify interval during the write operation, and to provide a read voltage to the memory cell during a read operation.

According to an aspect of another exemplary embodiment, there is provided a method of writing data in a cell array including a memory cell and a reference cell, the method including: providing a write voltage to the memory cell; programming the memory cell in a program interval; and verifying the memory cell in a verify interval subsequent to the program interval, wherein the programming includes disabling a sense amplifier, and wherein the verifying includes: providing the write voltage to the memory cell and the reference cell; enabling the sense amplifier; and sensing, by the enabled sense amplifier, a difference between a first current flowing through the memory cell and a second current flowing through the reference cell.

According to an aspect of another exemplary embodiment, there is provided a memory device including: a cell array including a memory cell and a reference cell; a sense amplifier configured to supply a current to the memory cell and the reference cell and sense a difference between a first current flowing through the memory cell and a second current flowing through the reference cell; a voltage driver configured to provide a write voltage to the memory cell during a write operation and to provide a read voltage to the memory cell during a read operation; and a controller configured to control the sense amplifier to sense the difference between the first current and the second current while providing the write voltage to the memory cell, to verify a programmed memory cell during the write operation.

According to an aspect of another exemplary embodiment, there is provided a method of writing data in a cell array comprising a memory cell and a reference cell, the method including: providing a write voltage to the memory cell based on a write operation; programming the memory cell; and verifying the programmed memory cell during the write operation, wherein the verifying includes sensing, by a sense amplifier, a difference between a first current flowing through the memory cell and a second current flowing through the reference cell while providing the write voltage to the memory cell.

BRIEF DESCRIPTION OF THE DRAWINGS

Embodiments of the inventive concept will be more clearly understood from the following detailed description taken in conjunction with the accompanying drawings in which.

DETAILED DESCRIPTION OF EMBODIMENTS

Figure 1:
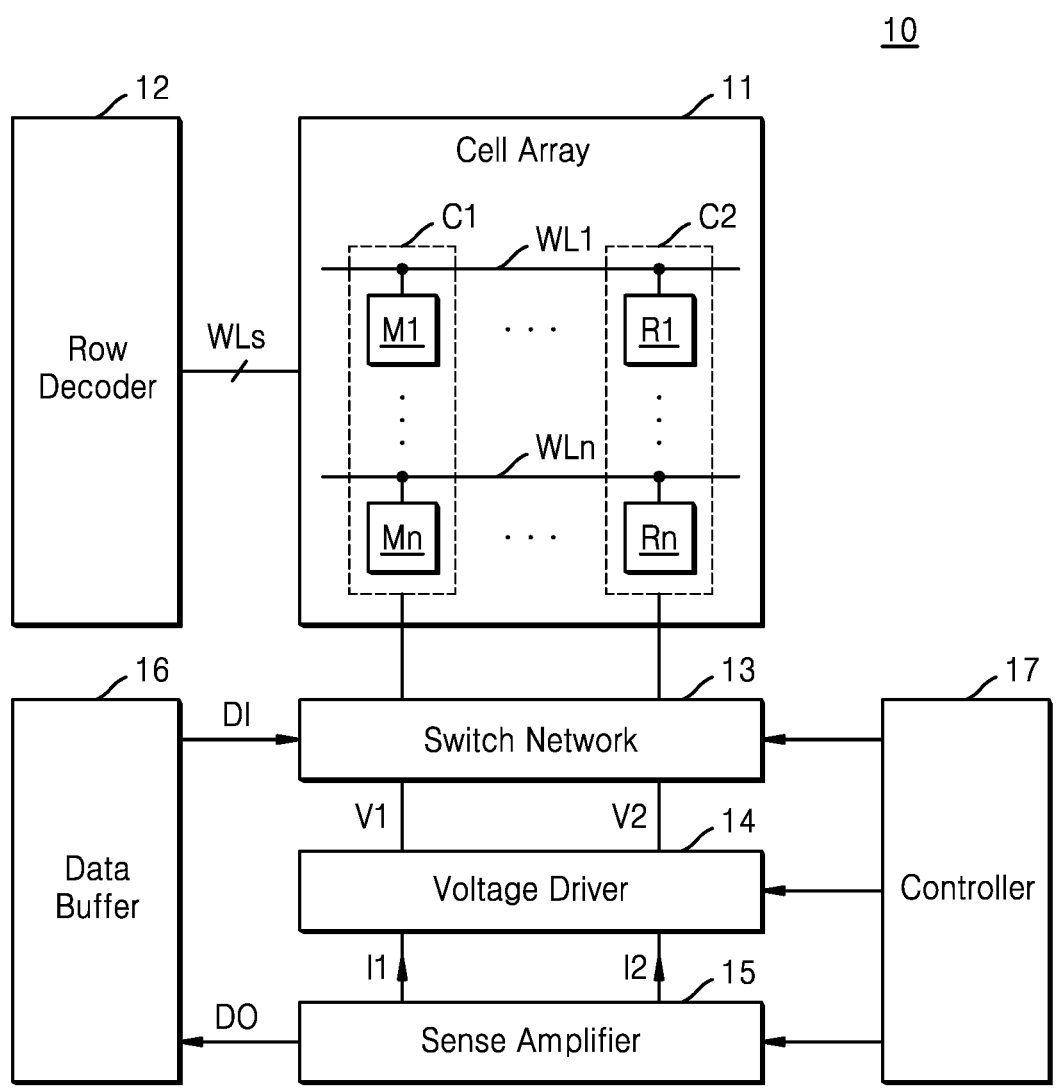
FIG. 1 is a block diagram of a memory device according to an exemplary embodiment.

FIG. 1 is a block diagram of a memory device 10 according to an exemplary embodiment. Referring to FIG. 1, the memory device 10 may include a cell array 11, a row decoder 12, a switch network 13, a voltage driver 14, a sense amplifier 15, a data buffer 16, and a controller 17.

The memory device 10 may receive a command and an address from the outside and receive or output data from or to the outside. For example, the memory device 10 may receive a write command or a read command and receive an address corresponding to the command. The memory device 10 may receive data in response to or based on the write command and output data in response to or based on the read command. In some embodiments, a command, an address, and data may be respectively received or transmitted through independent channels. Further, in some embodiments, at least two of a command, an address, and data may be received or transmitted through the same channel. Herein, an operation that is performed by the memory device 10 in response to or based on a write command may be referred to as a write operation, and an operation that is performed by the memory device 10 in response to or based on a read command may be referred to as a read operation.

The cell array 11 may include a plurality of memory cells (e.g., first to nth memory cells M1 to Mn). Each of the plurality of memory cells may include a variable resistance element (e.g., an MTJ of FIG. 3), and the variable resistance element may have a resistance corresponding to a value stored in a memory cell. Accordingly, the memory device 10 may be referred to as a resistive memory device, resistive random access memory (RRAM or ReRAM), or the like. For example, the cell array 11 may include, as a non-limiting example, a memory cell in a structure of a phase change memory, a phase change memory and switch (PCMS), RRAM, a ferroelectric memory, spin-transfer torque random access memory (STT-RAM), spin tunneling random access memory (STRAM), a magnetoresistive memory, a magnetic memory, magnetic random access memory (MRAM), a semiconductor-oxide-nitride-oxide-semiconductor (SONOS) memory, etc.

The cell array 11 may include a first column C1 including the first to nth memory cells M1 to Mn and a second column C2 including the first to nth reference cells R1 to Rn (where n is an integer greater than 1). The cell array 11 may further include a plurality of columns including memory cells in addition to those of the first column C1. The first to nth memory cells M1 to Mn included in the first column C1 may be mutually exclusively selected by a plurality of word lines WLs, and the first to nth reference cells R1 to Rn included in the second column C2 may also be mutually exclusively selected by the plurality of word lines WLs. For example, the first memory cell M1 and the first reference cell R1 may be selected by an activated first word line WL1, and the nth memory cell Mn and the nth reference cell Rn may be selected by an activated nth word line WLn. A reference cell (e.g., the first reference cell R1) selected by the same word line by which a memory cell (e.g., the first memory cell M1) is selected may be used to read data stored in the memory cell (e.g., the first memory cell M1) and to verify the memory cell (e.g., the first memory cell M1).

The first to nth memory cells M1 to Mn included in the first column C1 may commonly receive a first voltage V1 from the voltage driver 14 described below. In addition, the first to nth reference cells R1 to Rn included in the second column C2 may commonly receive a second voltage V2 from the voltage driver 14. Further, a first current I1 may flow through a memory cell selected by a word line from among the first to nth memory cells M1 to Mn included in the first column C1, and a second current I2 may flow through a reference cell selected by a word line from among the first to nth reference cells R1 to Rn included in the second column C2. Although FIG. 1 shows that the first current I1 and the second current I2 flow from the sense amplifier 15 toward the cell array 11, as described below with reference to FIGS. 5 and 6, the first current I1 and the second current I2 may flow from the cell array 11 toward the sense amplifier 15 (I1>0 and I2>0) in one or more other embodiments.

The switch network 13 may be controlled by the controller 17 and may set a path of the first current I1 flowing through a memory cell selected by a word line and a path of the second current I2 flowing through a reference cell selected by a word line. For example, as shown in FIG. 1, the switch network 13 may receive data to be written in a memory cell, i.e., input data DI, from the data buffer 16 during a write operation and set the path of the first current I1 according to the input data DI. In addition, the switch network 13 may set the path of the first current I1 to correspond to a path of the second current I2 during a read operation. As described below, the switch network 13 may also set the path of the first current I1 to correspond to the path of the second current I2 during a verify operation included in a write operation. Examples of the switch network 13 are described below with reference to FIGS. 3, 5, and 10.

The voltage driver 14 may be controlled by the controller 17, to provide the first voltage V1 to the first column C1, and to provide the second voltage V2 to the second column C2. For example, the voltage driver 14 may provide the first voltage V1 and the second voltage V2 of a first level to the first column C1 and the second column C2, respectively, during a write operation. In addition, the voltage driver 14 may provide the first voltage V1 and the second voltage V2 of a second level to the first column C1 and the second column C2, respectively, during a read operation. To prevent a state of variable resistance element included in a memory cell from being changed during a read operation, the magnitude of the first current I1 and the second current I2 during a read operation may be less than the magnitude of the first current I1 and the second current I2 during a write operation. The magnitude of the first current I1 and the second current I2 may be dependent on the first voltage V1 and the second voltage V2, and the voltage driver 14 may generate the first voltage V1 and the second voltage V2 such that the first current I1 and the second current I2, each of which has a magnitude during a write operation greater than that during a read operation, flow through the first column C1 and the second column C2, respectively. Examples of the voltage driver 14 are described below with reference to FIGS. 8A and 8B.

The sense amplifier 15 may be enabled by the controller 17, sense a difference between the first current I1 and the second current I2 in an enabled state, and provide output data DO corresponding to a sense result to the data buffer 16. When the sense amplifier 15 is disabled by the controller 17, the sense amplifier 15 may provide the first current I1 and the second current I2 to the cell array 11 or drain the first current I1 and the second current I2 from the cell array 11, through the voltage driver 14 and the switch network 13.

Examples of the sense amplifier 15 will be described below with reference to FIGS. 3, 5, 7A, and 7B.

The memory device 10 may perform programming and verification during a write operation. Programming or a program operation may indicate that a voltage and/or a current is provided to a memory cell such that a variable resistance element included in the memory cell has a resistance corresponding to data to be written. Verification or a verify operation may indicate that a voltage and/or a current is provided to a memory cell and a reference cell to determine whether a variable resistance element included in the memory cell has a resistance corresponding to desired data. As described below with reference to FIG. 2, the memory device 10 may repeat programming and verification in response to a write command.

The data buffer 16 may include a latch, store data, i.e., the input data DI, provided from the outside together with a write command, and store data, i.e., the output data DO, read from the cell array 11 in response to a read command. As shown in FIG. 1, the data buffer 16 may provide the input data DI to the switch network 13 and receive the output data DO from the sense amplifier 15. In addition, the data buffer 16 may determine whether a write operation is successful, by comparing the input data DI with the output data DO during a verify operation. Herein, the input data DI may be referred to as a signal indicating the input data DI, and outputting or receiving the signal indicating the input data DI may be simply represented as outputting or receiving the input data DI. In addition, the output data DO may be referred to as a signal indicating the output data DO, and outputting or receiving the signal indicating the output data DO may be simply represented as outputting or receiving the output data DO.

The controller 17 may control the switch network 13, the voltage driver 14, and the sense amplifier 15. For example, the controller 17 may generate control signals in response to a write command such that the switch network 13, the voltage driver 14, and the sense amplifier 15 perform a write operation. In addition, the controller 17 may generate control signals in response to a read command such that the switch network 13, the voltage driver 14, and the sense amplifier 15 perform a read operation. The controller 17 may be implemented as hardware, software, or a combination thereof (e.g., one or more processors executing software or instructions).

In order to verify a memory cell during a write operation, the controller 17 may enable the sense amplifier 15 while providing the first voltage V1 and the second voltage V2 of the first level to the first column C1 and the second column C2, respectively, for programming, and the sense amplifier 15 may generate the output data DO by sensing a difference between the first current I1 and the second current I2. Accordingly, controlling the switch network 13, the voltage driver 14, and the sense amplifier 15 for verification in the same manner as a read operation may be omitted, and verification of a memory cell may be completed early. In addition, while verifying a memory cell with the first voltage V1 and the second voltage V2 of the first level, the first current I1 and the second current I2 may have a relatively large magnitude. Accordingly, the verification may be less sensitive to a sensing margin of the sense amplifier 15. As a result, by efficiently verifying a memory cell, the reliability and efficiency of a write operation of the memory device 10 may increase.

Figure 2:
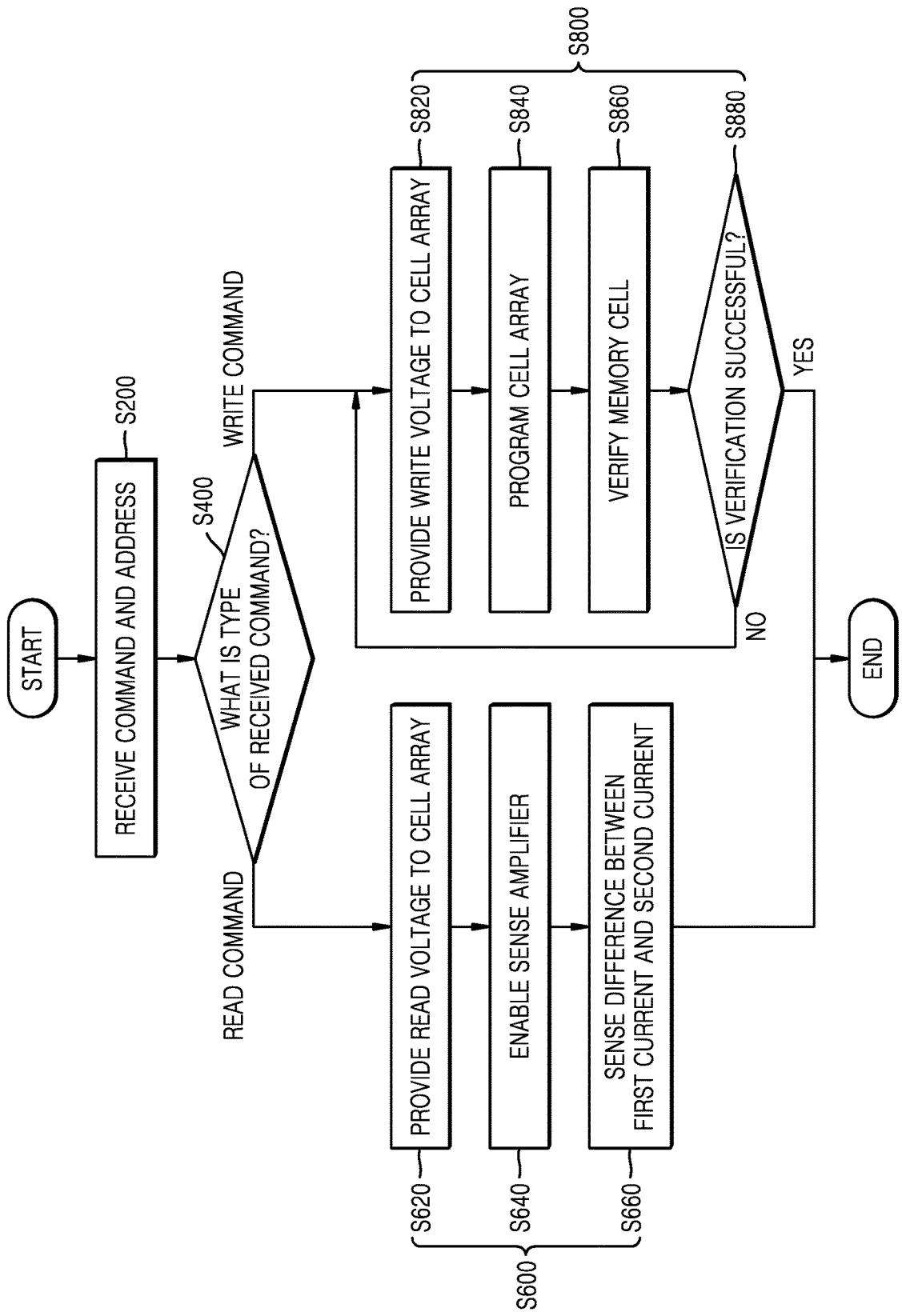
FIG. 2 is a flowchart of an operating method of a memory device, according to an exemplary embodiment.

FIG. 2 is a flowchart of an operating method of a memory device, according to an exemplary embodiment. As shown in FIG. 2, the operating method of a memory device may include a plurality of operations S200, S400, S600, and S800. In some embodiments, the method of FIG. 2 may be performed by the memory device 10 of FIG. 1. Hereinafter, FIG. 2 is described with reference to FIG. 1.

Referring to FIG. 2, in operation S200, an operation of receiving a command and an address may be performed. For example, the memory device 10 may receive a write command, an address, and data or receive a read command and an address. Thereafter, in operation S400, an operation of determining the command may be performed. As shown in FIG. 2, when (or based on) a read command is received, a read operation may be performed in operation S600, but when (or based on) a write command is received, a write operation may be performed in operation S800. Operation S600 of performing a read operation may include a plurality of operations S620, S640, and S660, and operation S800 of performing a write operation may include a plurality of operations S820, S840, S860, and S880.

When (or based on) a read command is received in operation S200, an operation of providing a read voltage to the cell array 11 may be performed in operation S620. For example, the controller 17 may control the voltage driver 14 to provide the first voltage V1 and the second voltage V2 of the second level to the cell array 11. As described above with reference to FIG. 1, the second level of the first voltage V1 and the second voltage V2 may cause the first current I1 and the second current I2 to have a smaller magnitude than that during a write operation, i.e., in operation S800. Thereafter, in operation S640, an operation of enabling the sense amplifier 15 may be performed. For example, the controller 17 may provide an activated control signal to the sense amplifier 15, and the sense amplifier 15 may be enabled in response to or based on the activated control signal. Thereafter, in operation S660, an operation of sensing a difference between the first current I1 and the second current I2 may be performed. For example, the sense amplifier 15 may amplify a difference between the first current I1 having passed through a memory cell and the second current I2 having passed through a reference cell and generate the amplified signal as the output data DO.

When (or based on) a write command is received in operation S200, an operation of providing a write voltage to the cell array 11 may be performed in operation S820. For example, the controller 17 may control the voltage driver 14 to provide the first voltage V1 and the second voltage V2 of the first level to the cell array 11. As described above with reference to FIG. 1, the first level of the first voltage V1 and the second voltage V2 may cause the first current I1 and the second current I2 to have a larger magnitude than that during a read operation, i.e., in operation S600.

In operation S840, an operation of programming a memory cell may be performed, and in operation S860, an operation of verifying the memory cell may be performed. Operations S840 and S860 may be performed in a state in which the write voltage is provided to the cell array 11 in operation S820. Accordingly, while verifying the memory cell in operation S860, the magnitude of the first current I1 and the second current I2 flowing through the memory cell and the reference cell, respectively, may be greater than that during a read operation, i.e., in operation S600. As described above with reference to FIG. 1, operation S860 of verifying the memory cell may be finished or completed within a short time, and accordingly, a time taken for the write operation, i.e., a time taken to perform operation S800, may be reduced. An example of operation S840 is described below with reference to FIG. 11, and an example of operation S860 is described below with reference to FIG. 12.

In operation S880, an operation of determining whether the verification is successful may be performed. For example, the data buffer 16 may compare the input data DI provided to the switch network 13 in operation S840 with the output data DO provided from the sense amplifier 15 in operation S860. When (or based on) the input data DI is the same as the output data DO, the data buffer 16 may determine that the verification is successful. Conversely, when (or based on) the input data DI differs from the output data DO, the data buffer 16 may determine that the verification has failed, and as shown in FIG. 2, operation S820 may subsequently be performed again. In some embodiments, a write voltage to be provided to the cell array 11 in operation S820 performed subsequently to operation S880 may be controlled such that the first current I1 and the second current I2 having a larger magnitude than that of the first current I1 and the second current I2 generated in operation S840 are generated.

Figure 3:
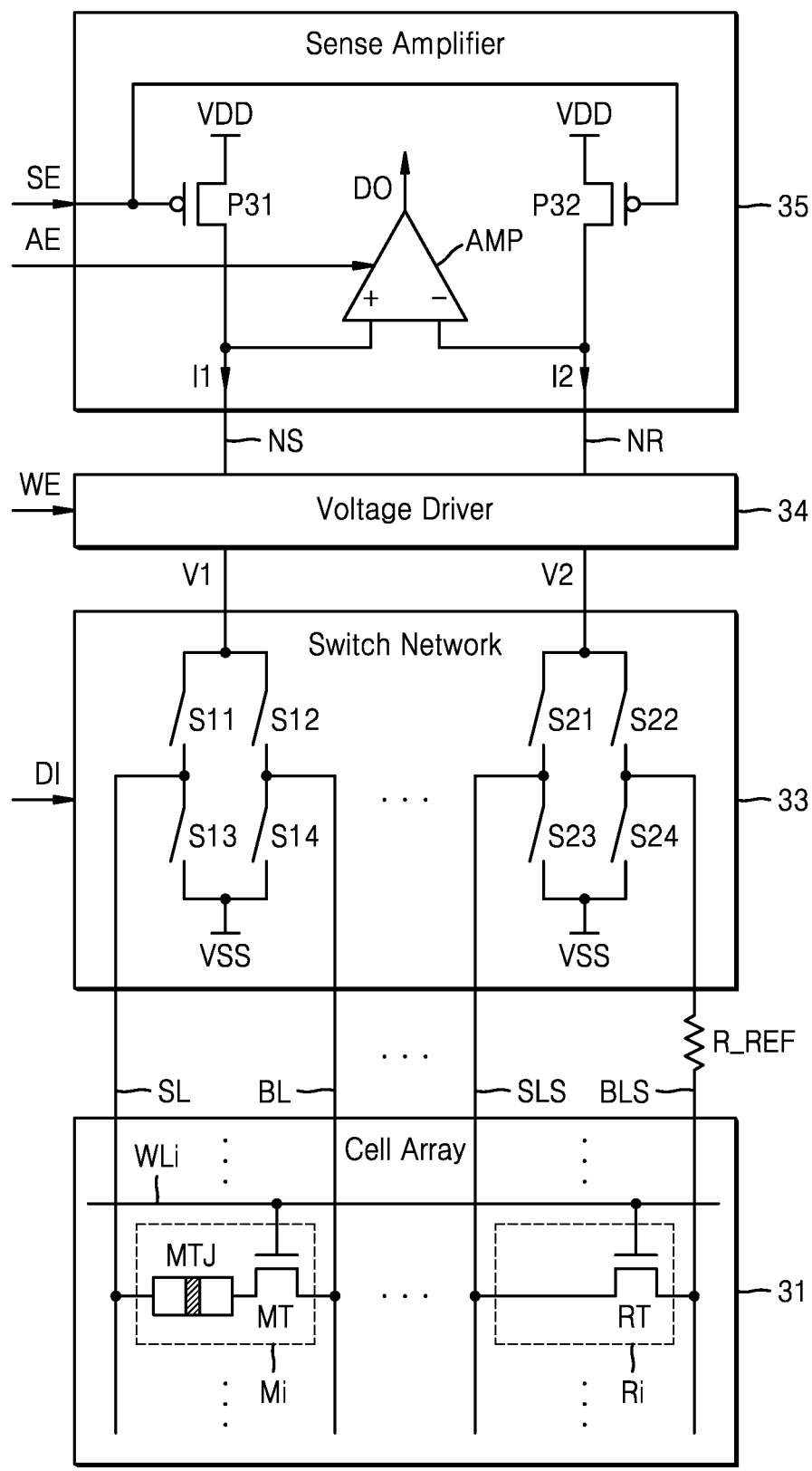
FIG. 3 is a block diagram of a memory device according to an exemplary embodiment.

FIG. 3 is a block diagram of a memory device 30 according to an exemplary embodiment. Referring to FIG. 3, memory device 30 includes a cell array 31, a switch network 33, a voltage driver 34, and a sense amplifier 35. Hereinafter, a description made with reference to FIG. 1 may not be repeated below with reference to FIG. 3.

The cell array 31 may include a memory cell Mi and a reference cell Ri connected to an ith word line WLi (1≤i≤n). As shown in FIG. 3, the memory cell Mi may include a variable resistance element MTJ and a memory cell transistor MT connected in series between a source line SL and a bit line BL. In some embodiments, the variable resistance element MTJ and the memory cell transistor MT may be connected in series between the source line SL and the bit line BL in a different order from that shown in FIG. 3. The memory cell transistor MT may have a gate connected to the ith word line WLi and electrically connect the variable resistance element MTJ to the bit line BL in response to or based on an activated ith word line WLi, i.e., a word line voltage $V_{WL}$ of a high level.

In some embodiments, the variable resistance element MTJ may be a magnetic tunnel junction (MTJ) element. For example, the variable resistance element MTJ may include a free layer and a pinned layer and include a barrier layer between the free layer and the pinned layer. A magnetization direction of the pinned layer may be fixed, whereas the free layer may have the same magnetization direction as or an opposite magnetization direction to that of the pinned layer. When (or based on) the pinned layer and the free layer have the same magnetization direction, the variable resistance element MTJ may be considered to be in a parallel state. Conversely, when (or based on) the pinned layer and the free layer have opposite magnetization directions, the variable resistance element MTJ may be considered to be in an anti-parallel state. In some embodiments, the variable resistance element MTJ may further include an anti-ferromagnetic layer such that the pinned layer has a fixed magnetization direction.

The variable resistance element MTJ may have a relatively low resistance in the parallel state and have a relatively high resistance in the anti-parallel state. Herein, when the variable resistance element MTJ in the parallel state has a low resistance, it is assumed that the memory cell Mi stores '0', and when the variable resistance element MTJ in the anti-parallel state has a high resistance, it is assumed that the memory cell Mi stores '1'. In addition, herein, a resistance corresponding to '0' may be referred to as a parallel resistance $R_P$, and a resistance corresponding to '1' may be referred to as an anti-parallel resistance $R_{AP}$.

The reference cell Ri may include a reference cell transistor RT connected between a reference source line SLS and a reference bit line BLS. The reference cell transistor RT may have a gate connected to the ith word line WLi and electrically connect the reference source line SLS to the reference bit line BLS in response to or based on the activated ith word line WLi, i.e., the word line voltage $V_{WL}$ of the high level. Accordingly, the reference cell Ri may be referred to as a short cell.

The reference bit line BLS may be connected to a reference resistor R_REF, and the reference resistor R_REF may have a resistance corresponding to a median value "$(R_{AP}+R_P)/2$" of the parallel resistance $R_P$ and the anti-parallel resistance $R_{AP}$. As shown in FIG. 3, the reference resistor R_REF arranged outside the cell array 31 may be free from a structural limitation of the cell array 31. For example, the reference resistor R_REF may be formed of a material (e.g., polysilicon) different from that of the variable resistance element MTJ. Accordingly, the reference resistor R_REF may be formed to easily have a desired resistance, e.g., the median value of the parallel resistance $R_P$ and the anti-parallel resistance $R_{AP}$, and may be relatively less sensitive to process voltage temperature (PVT) variation.

The switch network 33 may include a plurality of first switches S11 to S14 for forming a path of the first current I1 and a plurality of second switches S21 to S24 for forming a path of the second current I2. Herein, a switch may electrically connect both ends of the switch when the switch is turned on, and disconnect both the ends of the switch when the switch is turned off. The switch may have an arbitrary structure, for example, may include an re-channel field-effect transistor (NFET) or a p-channel field-effect transistor (PFET) that is turned on or off according to a gate voltage thereof or include an NFET and/or a PFET connected in series or in parallel to each other.

The switch network 33 may set a path of a current flowing through the memory cell Mi, i.e., the first current I1, according to data to be written in the memory cell Mi, i.e., the input data DI. For example, as shown in FIG. 3, the first current I1 may flow from the sense amplifier 35 to the switch network 33 by flowing through the voltage driver 34. When (or based on) only two first switches S11 and S14 among the plurality of first switches S11 to S14 are turned on, the first current I1 may flow through the first switch S11, the memory cell Mi, and the first switch S14, to a ground node to which a ground potential (or a negative supply voltage) VSS is applied. Alternatively, when (or based on) only two first switches S12 and S13 among the plurality of first switches S11 to S14 are turned on, the first current I1 may flow through the first switch S12, the memory cell Mi, and the first switch S13, to the ground node. Accordingly, the switch network 33 may set a direction of the first current I1 flowing through the memory cell Mi by turning on or off each of the plurality of first switches S11 to S14 according to the input data DI. Herein, it is assumed that the first current I1 flows, through the variable resistance element MTJ, from the bit line BL to the source line SL to write '0' in the memory cell Mi and flows, through the variable resistance element MTJ, from the source line SL to the bit line BL to write '1' in the memory cell Mi.

The switch network 33 may set a path of the second current I2 to correspond to the path of the first current I1 during a verify operation. For example, the plurality of second switches S21 to S24 may be replicas of the plurality of first switches S11 to S14 and may be turned on or off in the same manner as the plurality of first switches S11 to S14 during a verify operation. Accordingly, a difference between the path through which the first current I1 flows and the path through which the second current I2 flows may be removed, and the accuracy of the verification by the sense amplifier 35 that senses a difference between the first current I1 and the second current I2 may be improved. In some embodiments, the switch network 33 may block a current flowing through the reference cell Ri, i.e., the second current I2, during a program operation. Examples of the switch network 33 are described below with reference to FIGS. 9 and 10.

The voltage driver 34 may provide the first voltage V1 and the second voltage V2 to the cell array 31 through the switch network 33 and receive a write enable signal WE from the controller 17 of FIG. 1. The voltage driver 34 may provide the first voltage V1 and the second voltage V2 of a relatively high first level to the cell array 31 during a write operation, i.e., when (or based on) an activated write enable signal WE is received, and provide the first voltage V1 and the second voltage V2 of a relatively low second level to the cell array 31 during a read operation, i.e., when (or based on) an inactivated write enable signal WE is received. Examples of the voltage driver 34 are described below with reference to FIGS. 8A and 8B.

The sense amplifier 35 may receive a sense enable signal SE and an amplification enable signal AE from the controller 17 of FIG. 1 and sense, in an enabled state, a difference between the first current I1 flowing through a sense node NS and the second current I2 flowing through a reference node NR. As shown in FIG. 3, the sense amplifier 35 may include a first PFET P31 and a second PFET P32, which receive the sense enable signal SE, and a differential amplifier AMP that receives the amplification enable signal AE and generates the output data DO by amplifying the difference between the first current I1 and the second current I2. In the example of FIG. 3, the sense enable signal SE may be an active high signal. Accordingly, an activated sense enable signal SE may have the high level, e.g., a positive supply voltage VDD, and an inactivated sense enable signal SE may have a low level, e.g., the ground potential VSS. An example of an operation of the sense amplifier 35 based on the sense enable signal SE and the amplification enable signal AE is described below with reference to FIG. 4.

Figure 4:
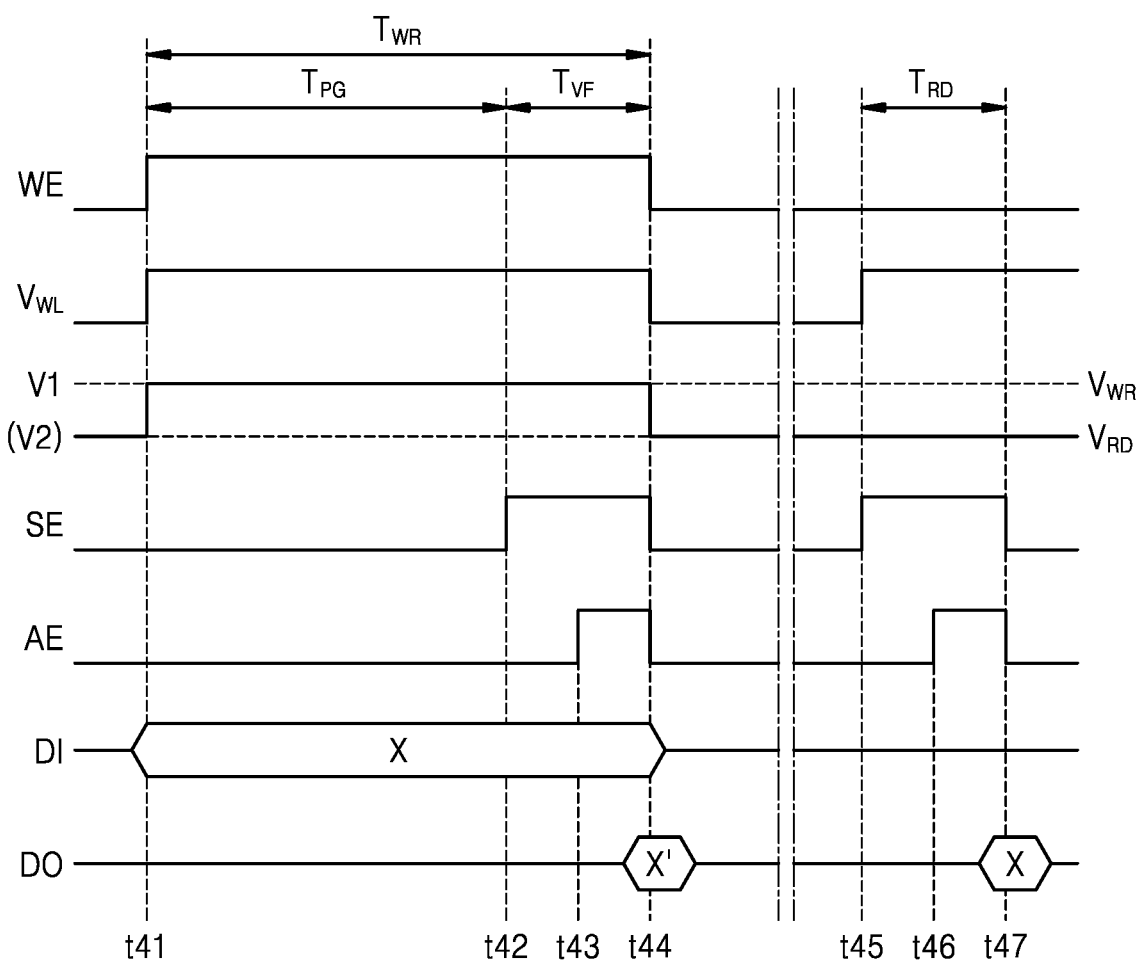
FIG. 4 is a timing diagram of an operation of a memory device, according to an exemplary embodiment.

FIG. 4 is a timing diagram of an operation of a memory device, according to an exemplary embodiment. Specifically, the timing diagram of FIG. 4 shows signals of the memory device 30 of FIG. 3 over time. In the example of FIG. 4, the write enable signal WE, the sense enable signal SE, and the amplification enable signal AE may be active high signals, and the word line voltage $V_{WL}$ indicates a voltage of the ith word line WLi of FIG. 3. Hereinafter, FIG. 4 is described with reference to FIG. 3.

Referring to FIG. 4, a write operation may be performed in a write interval $T_{WR}$, and a read operation may be performed in a read interval $T_{RD}$. The write interval $T_{WR}$ may include a program interval $T_{PG}$ and a verify interval $T_{VF}$, and as described above with reference to FIG. 2, when (or based on) verification fails in the verify interval $T_{VF}$, an additional program interval $T_{PG}$ and verify interval $T_{VF}$ may occur, and the write interval $T_{WR}$ may extend more than that shown in FIG. 4.

At a time t41, the input data DI may indicate a value X to be written in the memory cell Mi, and the write enable signal WE and the ith word line WLi may be activated. In response to or based on the activated write enable signal WE, the voltage driver 34 may provide the first voltage V1 and the second voltage V2 of a relatively high level $V_{WR}$ to the cell array 31. Herein, during a write operation, the level $V_{WR}$ to the first voltage V1 and the second voltage V2 may be referred to as a write voltage. In addition, the switch network 33 may set a path of the first current I1 according to the value X in response to or based on the activated write enable signal WE. Accordingly, to program the memory cell Mi, the first current I1 of a relatively large magnitude may flow through the memory cell Mi. In some embodiments, the switch network 33 may maintain the path of the first current I1 during the write interval $T_{WR}$, i.e., while the write enable signal WE is activated. The sense enable signal SE and the amplification enable signal AE may be inactivated, and accordingly, the sense amplifier 35 may be disabled, and the first current I1 may flow, through the first PFET P31, from a power supply node to which the positive supply voltage VDD is applied. In some embodiments, the switch network 33 may block the second current I2 flowing through the reference cell Ri, based on the inactivated sense enable signal SE regardless of the activated write enable signal WE.

At a time t42, the program interval $T_{PG}$ may end, and the sense enable signal SE may be activated to start the verify interval $T_{VF}$. Accordingly, the first current I1 may flow from the differential amplifier AMP instead of the first PFET P31. In addition, the switch network 33 may set a path of the second current I2 according to the value X in response to the activated sense enable signal SE, and the path of the second current I2 may correspond to the path of the first current I1. Accordingly, the second current I2 may flow from the differential amplifier AMP through the reference cell Ri and the reference resistor R_REF, and the first current I1 and the second current I2 may be developed. Based on a difference between a resistance of the variable resistance element MTJ and a resistance of the reference resistor R_REF, the first current I1 and the second current I2 may be differently developed, thereby causing a difference between the first current I1 and the second current I2. The magnitude of the first current I1 and the second current I2 may be greater in the verify interval $T_{VF}$ than in the read interval $T_{RD}$ described below, and a higher development speed may be provided. Accordingly, a verify operation may be less sensitive to a sensing margin of the sense amplifier 35 than a read operation, and in some embodiments, the verify interval Tw of FIG. 4 may be shorter than the read interval $T_{RD}$ ($T_{VF} < T_{RD}$).

At a time t43, the amplification enable signal AE may be activated, and accordingly, the differential amplifier AMP may generate the output data DO by amplifying the difference between the first current I1 and the second current I2. Thus, as shown in FIG. 4, the output data DO may indicate a value X' corresponding to data programmed in the memory cell Mi, and the data buffer 16 of FIG. 1 may determine whether a write operation is successful based on whether the value X is the same as the value X'. As shown in FIG. 4, the ith word line WLi may be activated in the whole write interval $T_{WR}$, i.e., during the program interval $T_{PG}$ and the verify interval $T_{VF}$.

At a time t44, the verify interval Tw may end, and the write enable signal WE, the ith word line WLi, the sense enable signal SE, and the amplification enable signal AE may be inactivated. The write driver 34 may provide the first voltage V1 and the second voltage V2 of a relatively low level $V_{RD}$ to the cell array 31 in response to or based on the inactivated write enable signal WE. Herein, the level $V_{RD}$ of the first voltage V1 and the second voltage V2 during a read operation may be referred to as a read voltage. In addition, the sense amplifier 35 may be disabled in response to the inactivated sense enable signal SE and amplification enable signal AE.

At a time t45, the sense enable signal SE and the ith word line WLi may be activated. In response to the inactivated write enable signal WE, the voltage driver 34 may provide the first voltage V1 and the second voltage V2 of the relatively low level $V_{RD}$ to the cell array 31, and the switch network 33 may set paths of the first current I1 and the second current I2, which correspond to each other. Accordingly, the first current I1 and the second current I2 of a relatively small magnitude may flow, through the memory cell Mi and the reference cell Ri, respectively, from the differential amplifier AMP. As a result, the magnitude of the first current I1 and the second current I2 may be limited not to change a state of the variable resistance element MTJ. Based on the difference between the resistance of the variable resistance element MTJ and the resistance of the reference resistor R_REF, the first current I1 and the second current I2 may be differently developed, thereby causing a difference between the first current I1 and the second current I2.

At a time t46, the amplification enable signal AE may be activated, and accordingly, the differential amplifier AMP may generate the output data DO by amplifying the difference between the first current I1 and the second current I2. Thus, as shown in FIG. 4, the output data DO may indicate the value X corresponding to the data successfully written in the memory cell Mi.

Figure 5:
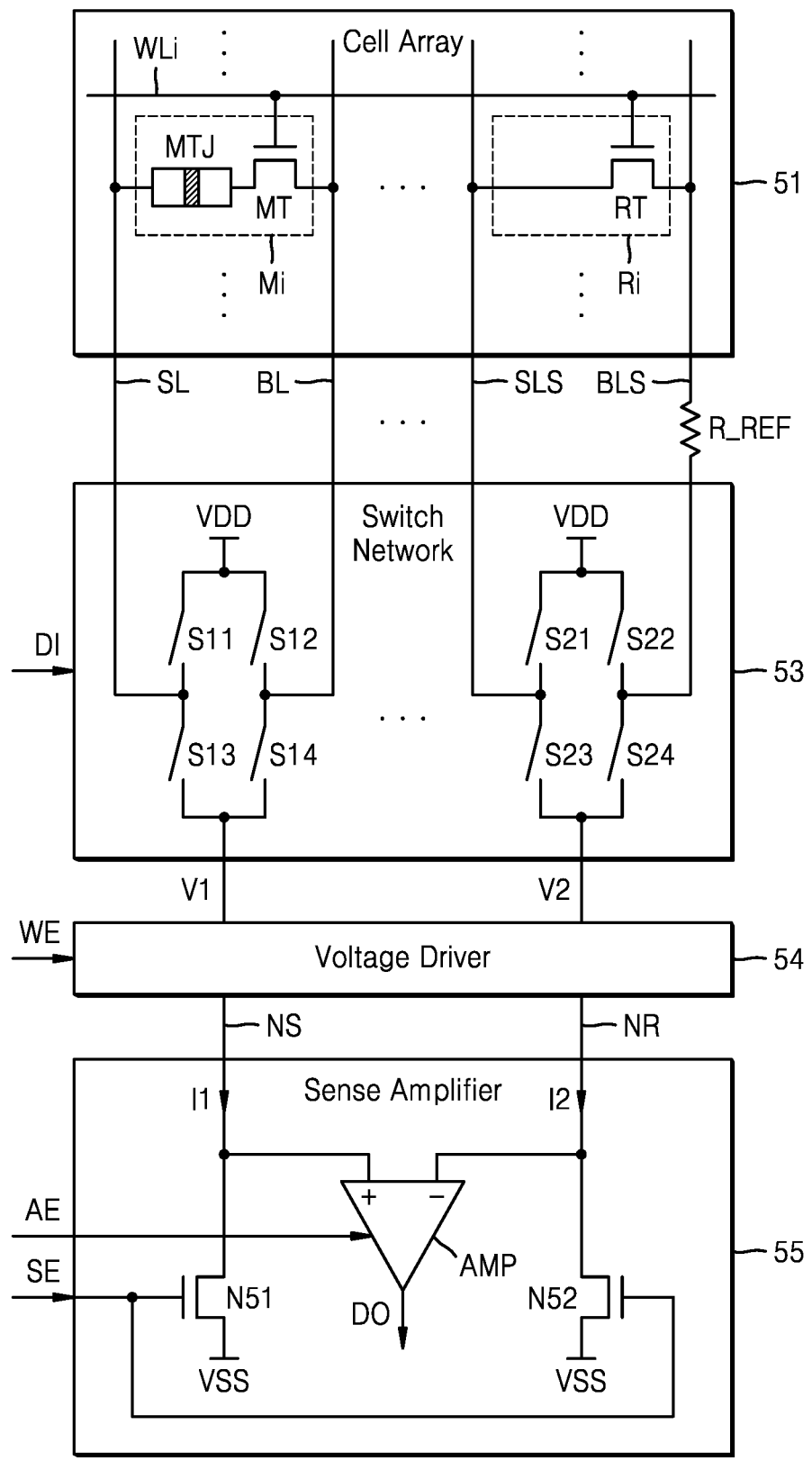
FIG. 5 is a block diagram of a memory device according to an exemplary embodiment.

FIG. 5 is a block diagram of a memory device 50 according to an exemplary embodiment. Referring to FIG. 5, the memory device 50 includes a cell array 51, a switch network 53, a voltage driver 54, and a sense amplifier 55. Compared with the memory device 30 of FIG. 3, in which the first current I1 and the second current I2 are supplied from the sense amplifier 35, the first current I1 and the second current I2 may flow to the sense amplifier 55 in the memory device 50 of FIG. 5. Hereinafter, a description made with reference to FIGS. 1 and 3 may not be repeated below with reference to FIG. 5.

The cell array 51 may include the memory cell Mi and the reference cell Ri connected to the ith word line WLi. The memory cell Mi may include the variable resistance element MTJ and the memory cell transistor MT and may be connected to the source line SL and the bit line BL. The reference cell Ri may include the reference cell transistor RT and may be connected to the reference source line SLS and the reference bit line BLS. In addition, the reference cell Ri may be connected to the reference resistor R_REF through the reference bit line BLS.

The switch network 53 may include the plurality of first switches S11 to S14 for forming a path of the first current I1 and the plurality of second switches S21 to S24 for forming a path of the second current I2. The plurality of first switches S11 to S14 may form different paths of the first current I1 according to the input data DI during a write operation. In addition, the plurality of second switches S21 to S24 may form a path of the second current I2, which corresponds to a path of the first current I1, during a verify operation.

The voltage driver 54 may receive the write enable signal WE and provide the first voltage V1 and the second voltage V2 to the cell array 51 through the switch network 53. The voltage driver 54 may provide the first voltage V1 and the second voltage V2 of a relatively low first level to the cell array 51 during a write operation, i.e., when (or based on) an activated write enable signal WE is received, and provide the first voltage V1 and the second voltage V2 of a relatively high second level to the cell array 51 during a read operation, i.e., when (or based on) an inactivated write enable signal WE is received. That is, the voltage driver 54 may provide the first voltage V1 and the second voltage V2 to the cell array 51 in each of a write operation and a read operation, which are different from the first voltage V1 and the second voltage V2 provided by the voltage driver 34 of FIG. 3, such that the first current I1 and the second current I2 of a relatively large magnitude are caused in the write operation, and the first current I1 and the second current I2 of a relatively small magnitude are caused in the read operation.

The sense amplifier 55 may receive the sense enable signal SE and the amplification enable signal AE and sense, in an enabled state, a difference between the first current I1 flowing through the sense node NS and the second current I2 flowing through the reference node NR. As shown in FIG. 5, the sense amplifier 55 may include a first NFET N51 and a second NFET N52 that receive the sense enable signal SE, and include the differential amplifier AMP that receives the amplification enable signal AE and generates the output data DO by amplifying the difference between the first current I1 and the second current I2. In FIG. 5, the sense enable signal SE may be an active low signal. Accordingly, an activated sense enable signal SE may have the low level, e.g., the ground potential VSS, and an inactivated sense enable signal SE may have the high level, e.g., the positive supply voltage VDD. An example of an operation of the sense amplifier 55 based on the sense enable signal SE and the amplification enable signal AE is described below with reference to FIG. 6.

Figure 6:
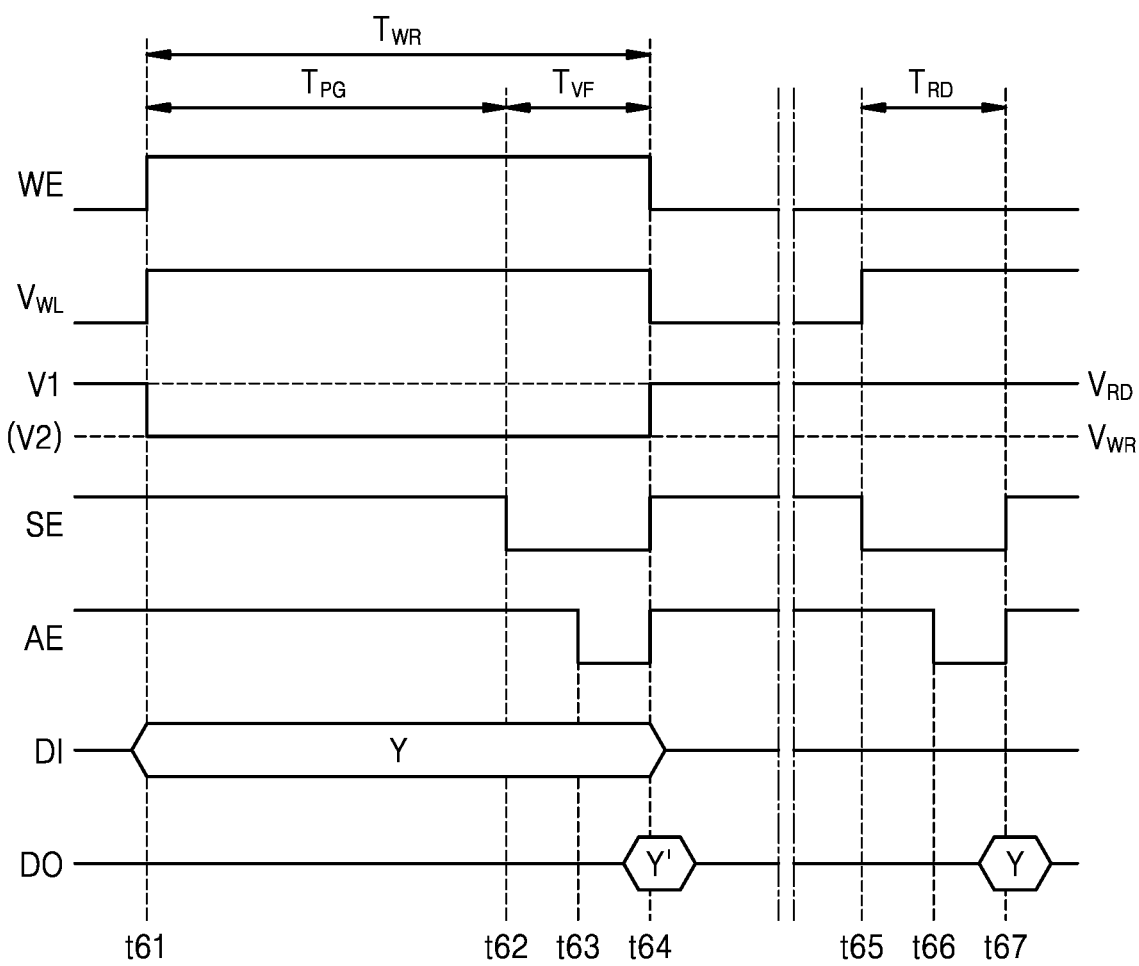
FIG. 6 is a timing diagram of an operation of a memory device, according to an exemplary embodiment.

FIG. 6 is a timing diagram of an operation of a memory device, according to an exemplary embodiment. Specifically, the timing diagram of FIG. 6 shows signals of the memory device 50 of FIG. 5 over time. In the example of FIG. 6, the write enable signal WE may be an active high signal, and the sense enable signal SE and the amplification enable signal AE may be active low signals. In addition, the word line voltage $V_{WL}$, indicates a voltage of the ith word line WLi of FIG. 5. Hereinafter, FIG. 6 is described with reference to FIG. 5, and a description made with reference to FIG. 4 may not be repeated below with reference to FIG. 6.

Referring to FIG. 6, a write operation may be performed in a write interval $T_{WR}$, and a read operation may be performed in a read interval $T_{RD}$. The write interval $T_{WR}$ may include a program interval $T_{PG}$ and a verify interval $T_{VF}$. Further, as described above with reference to FIG. 2, when (or based on) verification fails in the verify interval $T_{VF}$, an additional program interval $T_{PG}$ and verify interval $T_{VF}$ may occur, and the write interval $T_{WR}$ may extend more than that shown in FIG. 6.

At a time t61, the input data DI may indicate a value Y to be written in the memory cell Mi, and the write enable signal WE and the ith word line WLi may be activated. In response to the activated write enable signal WE, the voltage driver 54 may provide the first voltage V1 and the second voltage V2 of a relatively low level $V_{WR}$ to the cell array 51. In addition, the switch network 53 may set a path of the first current I1 according to the value Y in response to the activated write enable signal WE. Accordingly, to program the memory cell Mi, the first current I1 of a relatively large magnitude may flow through the memory cell Mi. In some embodiments, the switch network 53 may maintain the path of the first current I1 in the write interval $T_{WR}$, i.e., while the write enable signal WE is activated. The sense enable signal SE and the amplification enable signal AE may be inactivated, and accordingly, the sense amplifier 55 may be disabled, and the first current I1 may flow to a ground node through the first NFET N51. In some embodiments, the switch network 53 may block the second current I2 flowing through the reference cell Ri, based on the inactivated sense enable signal SE regardless of the activated write enable signal WE.

At a time t62, the program interval $T_{PG}$ may end, and the sense enable signal SE may be activated to start the verify interval $T_{VF}$. Accordingly, the first current I1 may flow to the differential amplifier AMP instead of the first NFET N51. In addition, the switch network 33 may set a path of the second current I2 according to the value Y in response to the activated sense enable signal SE, and the path of the second current I2 may correspond to the path of the first current I1. Accordingly, the second current I2 may flow to the differential amplifier AMP through the reference cell Ri and the reference resistor R_REF, and the first current I1 and the second current I2 may be developed. Based on a difference between the resistance of the variable resistance element MTJ and the resistance of the reference resistor R_REF, the first current I1 and the second current I2 may be differently developed, thereby causing a difference between the first current I1 and the second current I2. Compared with the read interval $T_{RD}$ described below, in the verify interval $T_{VF}$, the magnitude of the first current I1 and the second current I2 may be greater, and a higher development speed may be provided. Accordingly, a verify operation may be less sensitive to a sensing margin of the sense amplifier 55 than a read operation, and in some embodiments, the verify interval $T_{VF}$ of FIG. 6 may be shorter than the read interval $T_{RD}$ ($T_{VF}<T_{RD}$).

At a time t63, the amplification enable signal AE may be activated, and accordingly, the differential amplifier AMP may generate the output data DO by amplifying the difference between the first current I1 and the second current I2. Thus, as shown in FIG. 6, the output data DO may indicate a value Y' corresponding to data programmed in the memory cell Mi, and the data buffer 16 of FIG. 1 may determine whether a write operation is successful according to whether the value Y is the same as the value Y'. As shown in FIG. 6, the ith word line WLi may be activated in the whole write interval $T_{WR}$, i.e., during the program interval $T_{PG}$ and the verify interval $T_{VF}$.

At a time t64, the verify interval $T_{VF}$ may end, and the write enable signal WE, the ith word line WLi, the sense enable signal SE, and the amplification enable signal AE may be inactivated. The write driver 54 may provide the first voltage V1 and the second voltage V2 of a relatively high level $V_{RD}$ to the cell array 51 in response to or based on the inactivated write enable signal WE. In addition, the sense amplifier 55 may be disabled in response to or based on the inactivated sense enable signal SE and amplification enable signal AE.

At a time t65, the sense enable signal SE and the ith word line WLi may be activated. In response to the inactivated write enable signal WE, the voltage driver 54 may provide the first voltage V1 and the second voltage V2 of the relatively high level $V_{RD}$ to the cell array 51, and the switch network 53 may set paths of the first current I1 and the second current I2, which correspond to each other. Accordingly, the first current I1 and the second current I2 of a relatively small magnitude may flow, through the memory cell Mi and the reference cell Ri, respectively, to the differential amplifier AMP, and as a result, the magnitude of the first current I1 and the second current I2 may be limited not to change a state of the variable resistance element MTJ. Based on a difference between the resistance of the variable resistance element MTJ and the resistance of the reference resistor R_REF, the first current I1 and the second current I2 may be differently developed, thereby causing a difference between the first current I1 and the second current I2.

At a time t66, the amplification enable signal AE may be activated, and accordingly, the differential amplifier AMP may generate the output data DO by amplifying the difference between the first current I1 and the second current I2. Thus, as shown in FIG. 6, the output data DO may indicate the value Y corresponding to the data successfully written in the memory cell Mi.

Figure 7A:
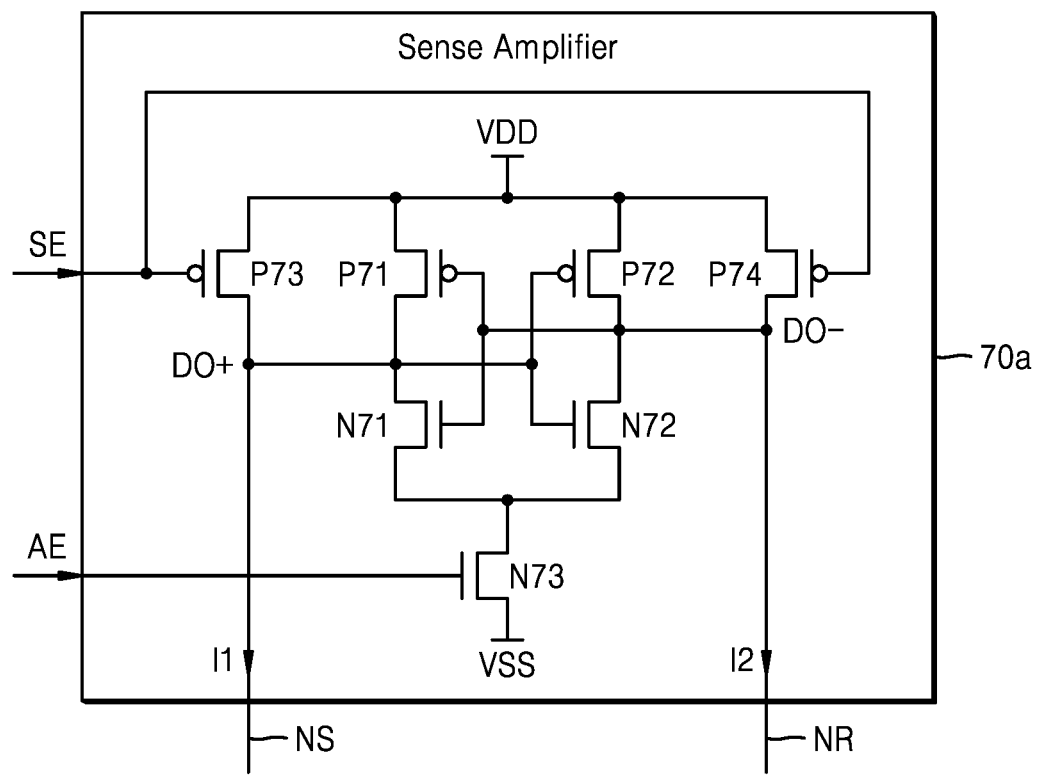
FIGS. 7A and 7B are circuit diagrams of sense amplifiers according to exemplary embodiments.
Figure 7B:
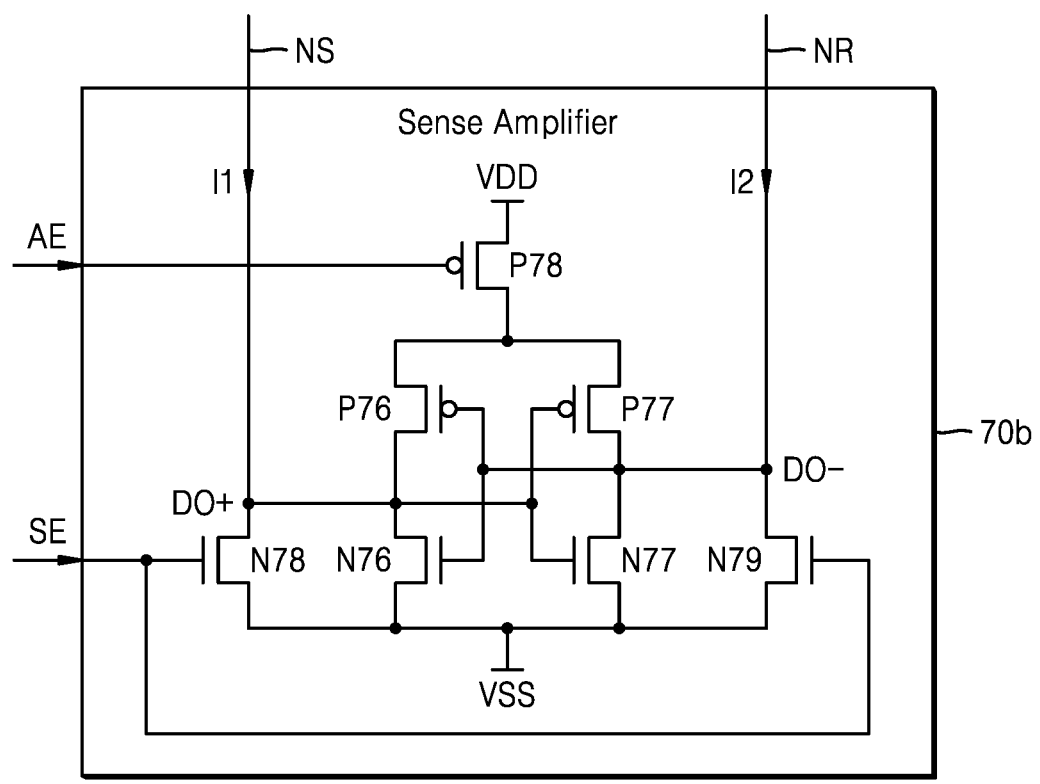

FIGS. 7A and 7B are circuit diagrams of sense amplifiers according to exemplary embodiments. Specifically, the circuit diagram of FIG. 7A shows an example of the sense amplifier 35 of FIG. 3, and the circuit diagram of FIG. 7B shows an example of the sense amplifier 55 of FIG. 5. The sense enable signal SE and the amplification enable signal AE may be active high signals in a sense amplifier 70a of FIG. 7A, whereas the sense enable signal SE and the amplification enable signal AE may be active low signals in a sense amplifier 70b of FIG. 7B. However, the sense amplifiers 35 and 55 of FIGS. 3 and 5 are not limited to the sense amplifiers 70a and 70b of FIGS. 7A and 7B. Hereinafter, a description made with reference to FIG. 7A may not be repeated in a description made with reference to FIG. 7B below, and vice versa.

Referring to FIG. 7A, the sense amplifier 70a may include first to third NFETs N71 to N73 and first to fourth PFETs P71 to P74. The third PFET P73 and the fourth PFET P74 may have gates receiving the sense enable signal SE, and may correspond to the first PFET P31 and the second PFET P32 of FIG. 3, respectively. The first NFET N71 and the second NFET N72 and the first PFET P71 and the second PFET P72 may form an inverter pair cross-coupled between the sense node NS and the reference node NR, and the third NFET N73 may control a power supply current flowing through the inverter pair, based on the amplification enable signal AE. Accordingly, the sense amplifier 70a may develop the first current I1 and the second current I2 in response to or based on the activated sense enable signal SE and generate signals DO+ and DO− corresponding to the output data DO by amplifying a difference between the first current I1 and the second current I2 in response to or based on the activated amplification enable signal AE.

Referring to FIG. 7B, the sense amplifier 70b may include sixth to ninth NFETs N76 to N79 and sixth to eighth PFETs P76 to P78. The eighth NFET N78 and the ninth NFET N79 may have gates receiving the sense enable signal SE, and may correspond to the first NFET N51 and the second NFET N52 of FIG. 5, respectively. The sixth NFET N76 and the seventh NFET N77 and the sixth PFET P76 and the seventh PFET P77 may form an inverter pair cross-coupled between the sense node NS and the reference node NR, and the eighth PFET P78 may control a power supply current flowing through the inverter pair, based on the amplification enable signal AE. Accordingly, the sense amplifier 70b may develop the first current I1 and the second current I2 in response to or based on the activated sense enable signal SE and generate signals DO+ and DO− corresponding to the output data DO by amplifying a difference between the first current I1 and the second current I2 in response to or based on the activated amplification enable signal AE.

Figure 8A:
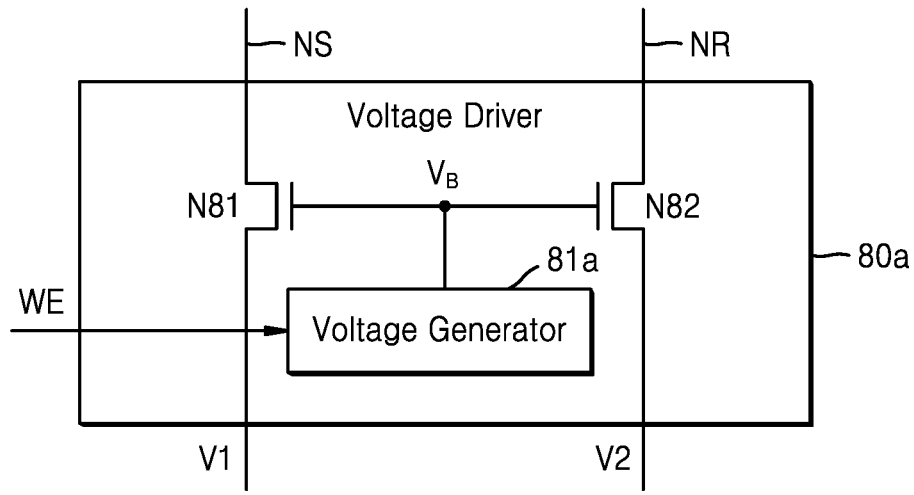
FIGS. 8A and 8B are circuit diagrams of voltage drivers according to exemplary embodiments.
Figure 8B:
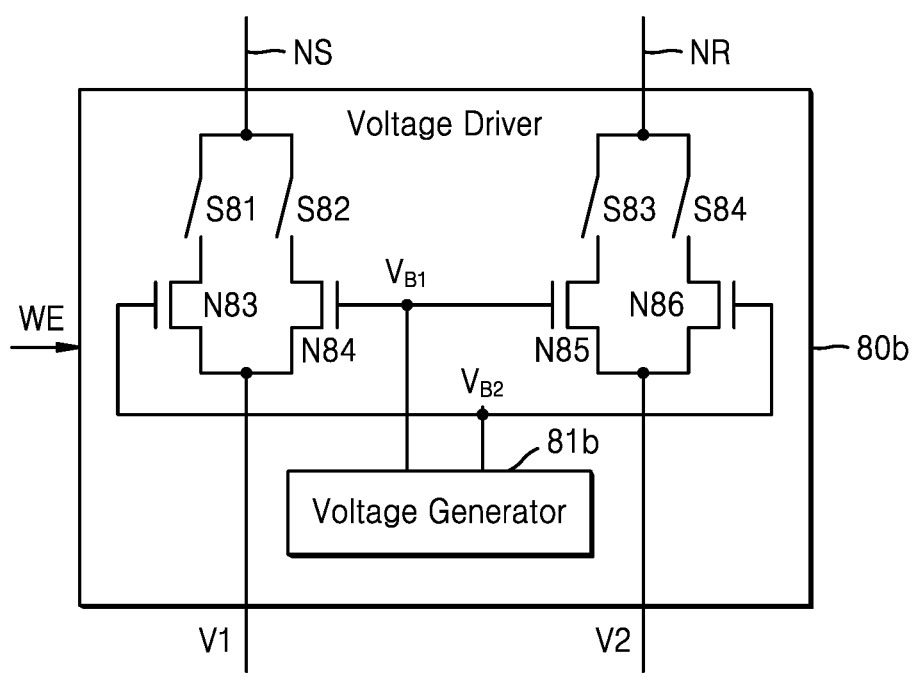

FIGS. 8A and 8B are circuit diagrams of voltage drivers according to exemplary embodiments. Specifically, the circuit diagrams of FIGS. 8A and 8B show examples of the voltage driver 34 of FIG. 3. As described above with reference to FIG. 3, voltage drivers 80a and 80b of FIGS. 8A and 8B may provide the first voltage V1 and the second voltage V2 of a relatively high first level to the cell array 31 in response to or based on the activated write enable signal WE and provide the first voltage V1 and the second voltage V2 of a relatively low second level to the cell array 31 in response to or based on the inactivated write enable signal WE. Hereinafter, FIGS. 8A and 8B are described with reference to FIG. 3, wherein a description made with reference to FIG. 8A may not be repeated below in a description to be made with reference to FIG. 8B, and vice versa.

Referring to FIG. 8A, the voltage driver 80a may be connected to the sense amplifier 35 through the sense node NS and the reference node NR and provide the first voltage V1 and the second voltage V2 to the cell array 31 through the switch network 33. As shown in FIG. 8A, the voltage driver 80a may include a voltage generator 81a, a first NFET N81, and a second NFET N82. The voltage generator 81a may receive the write enable signal WE and provide a bias voltage VB to gates of the first NFET N81 and the second NFET N82. The voltage generator 81a may generate the bias voltage VB based on the write enable signal WE. For example, the voltage generator 81a may generate a relatively high bias voltage VB in response to or based on the activated write enable signal WE, and accordingly, a relatively high first voltage V1 and second voltage V2 may be provided to the cell array 31. In some embodiments, the voltage generator 81a may include a charge pump and provide the bias voltage VB greater than the positive supply voltage VDD of FIG. 3 to the first NFET N81 and the second NFET N82 in response to or based on the activated write enable signal WE. In some embodiments, the voltage generator 81a may generate the bias voltage VB so as to provide a higher first voltage V1 and second voltage V2 to the cell array 31 as program intervals included in a single read operation are repeated. Alternatively, the voltage generator 81a may generate a relatively low bias voltage VB in response to the inactivated write enable signal WE, and accordingly, a relatively low first voltage V1 and second voltage V2 may be provided to the cell array 31.

Referring to FIG. 8B, the voltage driver 80b may include a voltage generator 81b, first to fourth switches S81 to S84, and third to sixth NFETs N83 and N86. The voltage generator 81b may receive the write enable signal WE, provide a first bias voltage $V_{B1}$ to gates of the fourth NFET N84 and the fifth NFET N85, and provide a second bias voltage $V_{B2}$ to gates of the third NFET N83 and the sixth NFET N86. For example, the voltage generator 81b may include a first voltage generator generating the first bias voltage $V_{B1}$ and a second voltage generator generating the second bias voltage $V_{B2}$. Herein, the first voltage generator may be referred to as a write voltage generator and the second voltage generator may be referred to as a read voltage generator. The voltage generator 81b may generate the first bias voltage $V_{B1}$ higher than the second bias voltage $V_{B2}$. For example, the voltage generator 81b may include a charge pump and generate the first bias voltage $V_{B1}$ greater than the positive supply voltage VDD of FIG. 3. Accordingly, the first voltage V1 and the second voltage V2 generated by the fourth NFET N84 and the fifth NFET N85 may be higher than the first voltage V1 and the second voltage V2 generated by the third NFET N83 and the sixth NFET N86.

Each of the first to fourth switches S81 to S84 may be turned on or off according to the write enable signal WE. For example, when (or based on) the write enable signal WE is activated, e.g., during a write operation, the second switch S82 and the third switch S83 respectively connected to the fourth NFET N84 and the fifth NFET N85 that receive the relatively high first bias voltage $V_{B1}$ may be turned on, and the first switch S81 and the fourth switch S84 respectively connected to the third NFET N83 and the sixth NFET N86 that receive the relatively low second bias voltage $V_{B2}$ may be turned off. In addition, when (or based on) the write enable signal WE is inactivated, e.g., during a read operation, the first switch S81 and the fourth switch S84 respectively connected to the third NFET N83 and the sixth NFET N86 that receive the relatively low second bias voltage $V_{B2}$ may be turned on, and the second switch S82 and the third switch S83 respectively connected to the fourth NFET N84 and the fifth NFET N85 that receive the relatively high first bias voltage $V_{B1}$ may be turned off.

Although the circuit diagrams of FIGS. 8A and 8B show examples of the voltage driver 34 of FIG. 3, it is understood that the voltage driver 54 of FIG. 5 may also have a similar structure to those of the voltage drivers 80a and 80b of FIGS. 8A and 8B. For example, the voltage driver 54 of FIG. 5 may have a structure in which the NFETs in the voltage drivers 80a and 80b of FIGS. 8A and 8B are replaced with PFETs, wherein the voltage generators 81a and 81b may generate bias voltages in an opposite manner to that described above with reference to FIGS. 8A and 8B.

Figure 9:
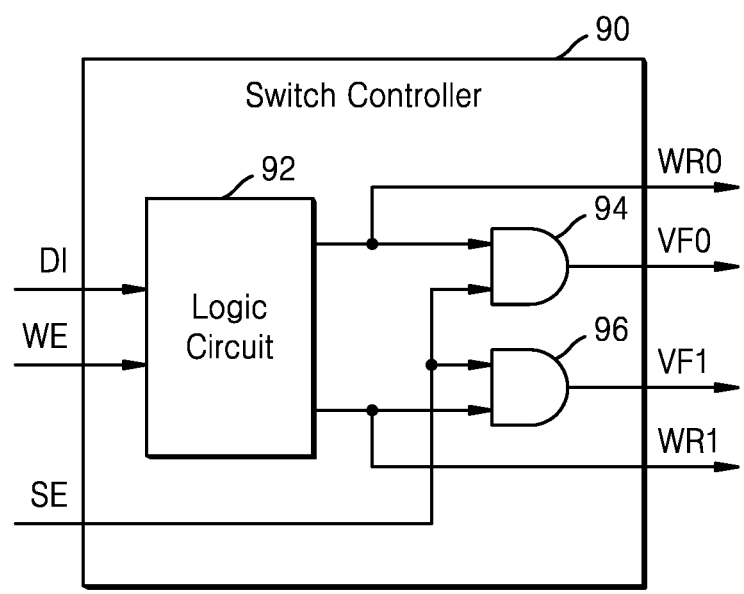
FIG. 9 is a block diagram of a switch controller according to an exemplary embodiment.

FIG. 9 is a block diagram of a switch controller 90 according to an exemplary embodiment. The switch controller 90 according to the present embodiment is configured to control switches included in the switch network 13 of FIG. 1. In some embodiments, the switch controller 90 may be included in the switch network 13 of FIG. 1 or in the controller 17 of FIG. 1. It is assumed in FIG. 9 that the write enable signal WE, the sense enable signal SE, a zero write signal WR0, a one write signal WR1, a zero verify signal VF0, and a one verify signal VF1 are active high signals, and FIG. 9 will be described with reference to FIG. 1.

Referring to FIG. 9, the switch controller 90 may include a logic circuit 92, a first NAND gate 94 and a second NAND gate 96. The logic circuit 92 may include at least one logic gate and generate the zero write signal WR0 and the one write signal WR1 mutually exclusively activated based on the input data DI and the write enable signal WE. For example, when (or based on) the write enable signal WE is activated, the logic circuit 92 may generate an activated zero write signal WR0 in response to or based on the input data DI indicating '0' and generate an activated one write signal WR1 in response to or based on the input data DI indicating '1'.

The first NAND gate 94 may receive the zero write signal WR0 and the sense enable signal SE and generate, when (or based on) both the zero write signal WR0 and the sense enable signal SE are activated, an activated zero verify signal VF0. In addition, the second NAND gate 96 may receive the one write signal WR1 and the sense enable signal SE and generate, when (or based on) both the one write signal WR1 and the sense enable signal SE are activated, an activated one verify signal VF1. Accordingly, when (or based on) the write enable signal WE or the sense enable signal SE is inactivated, both the zero verify signal VF0 and the one verify signal VF1 may be inactivated, but when (or based on) both the write enable signal WE and the sense enable signal SE are activated, i.e., in a verify interval (e.g., Tw of FIGS. 4 and 6), the zero verify signal VF0 and the one verify signal VF1 may be activated or inactivated according to the input data DI. An example of controlling switches based on the zero write signal WR0, the one write signal WR1, the zero verify signal VF0, and the one verify signal VF1 output from the switch controller 90 is described below with reference to FIG. 10.

Figure 10:
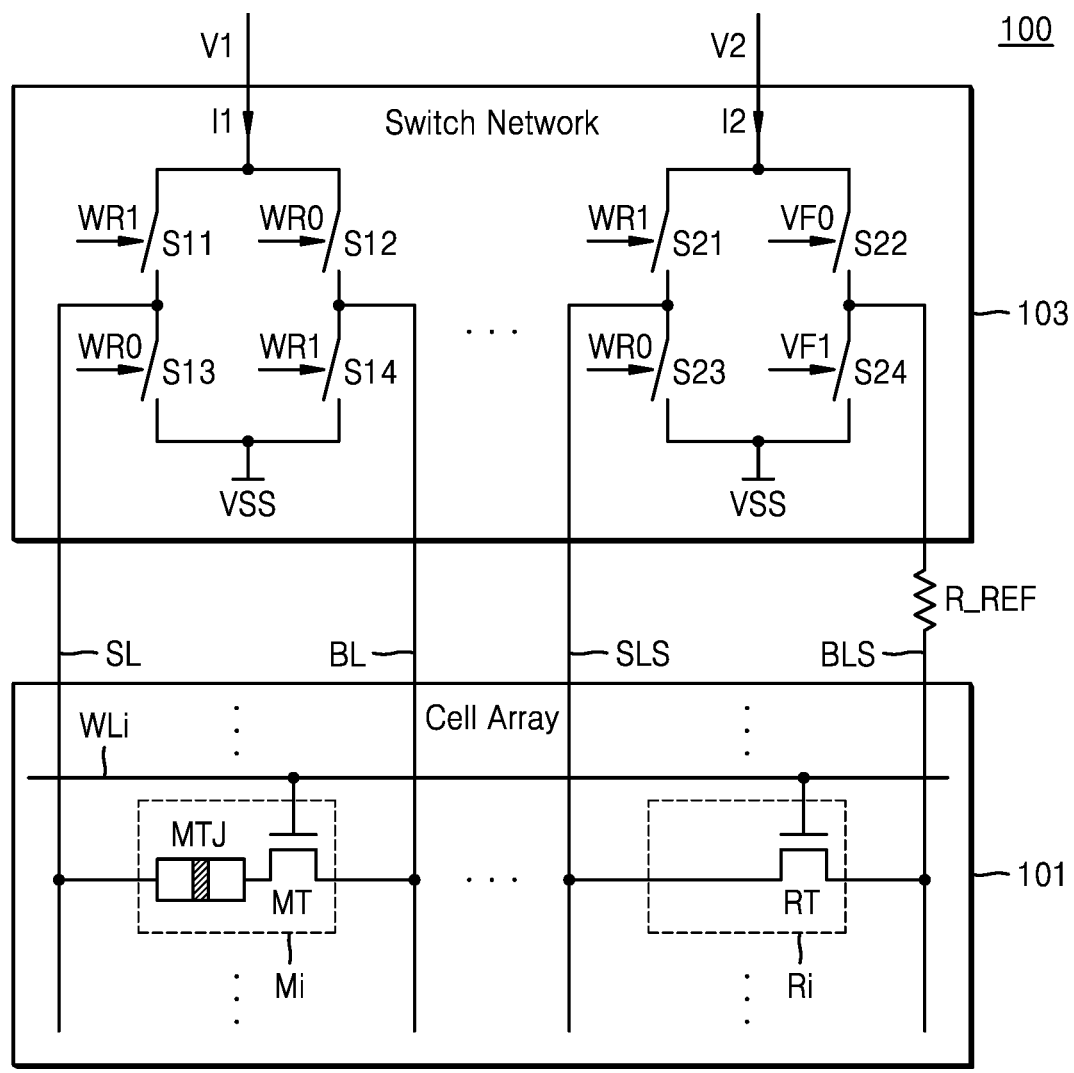
FIG. 10 is a block diagram of a switch network according to an exemplary embodiment.

FIG. 10 is a block diagram of a switch network 103 according to an exemplary embodiment. Specifically, the block diagram of FIG. 10 shows a memory device 100 including a switch network 103 including switches controlled by the switch controller 90 of FIG. 9 and a cell array 101 connected to the switch network 103. Although the memory device 100 of FIG. 10 corresponds to an example in which the first current I1 and the second current I2 are provided from a sense amplifier like the memory device 30 of FIG. 3, it is understood that the switch network 53 in the memory device 50 of FIG. 5, in which the first current I1 and the second current I2 flow to the sense amplifier 55, may be controlled similarly to the switch network 103 of FIG. 10. Hereinafter, FIG. 10 is described with reference to FIG. 9.

The cell array 101 may include the memory cell Mi and the reference cell Ri connected to the ith word line WLi. The memory cell Mi may include the variable resistance element MTJ and the memory cell transistor MT and may be connected to the source line SL and the bit line BL. The reference cell Ri may include the reference cell transistor RT and may be connected to the reference bit line BLS and the reference source line SLS. In addition, the reference cell Ri may be connected to the reference resistor R_REF through the reference bit line BLS.

The switch network 103 may include the plurality of first switches S11 to S14 for forming a path of the first current I1 and the plurality of second switches S21 to S24 for forming a path of the second current I2. In a program interval (e.g., $T_{PG}$ of FIG. 4), when (or based on) the write enable signal WE is activated and the input data DI indicates '0', the two first switches S12 and S13 may be turned on in response to or based on the activated zero write signal WR0, and the first current I1 may flow, through the memory cell Mi, from the bit line BL to the source line SL. In addition, the second switch S23 may be turned on in response to or based on the activated zero write signal WR0, the second switch S22 may be turned off in response to or based on an inactivated zero verify signal VF0, and accordingly, the second current I2 flowing through the reference cell Ri may be blocked. Similarly, in the program interval, when (or based on) the write enable signal WE is activated and the input data DI indicates '1', the two first switches S11 and S14 may be turned on in response to or based on an activated one write signal WR1, and the first current I1 may flow, through the memory cell Mi, from the source line SL to the bit line BL. In addition, the second switch S21 may be turned on in response to or based on the activated one write signal WR1, the second switch S24 may be turned off in response to or based on an inactivated zero verify signal VF1, and accordingly, the second current I2 flowing through the reference cell Ri may be blocked.

In a verify interval (e.g., $T_{VF}$ of FIG. 4) subsequent to the program interval, when (or based on) the sense enable signal SE is activated and the input data DI indicates '0', the plurality of first switches S11 to S14 may maintain the same state as in the program interval, the second switch S22 may be turned on in response to or based on the activated zero verify signal VF0, and accordingly, the second current I2 may flow, through the reference resistor R_REF, the reference bit line BLS, and the reference cell Ri, to the reference source line SLS. Similarly, in the verify interval, when (or based on) the sense enable signal SE is activated and the input data DI indicates '1', the plurality of first switches S11 to S14 may maintain the same state as in the program interval, the second switch S24 may be turned on in response to or based on the activated one verify signal VF1, and accordingly, the second current I2 may flow, through the reference cell Ri, the reference bit line BLS, and the reference resistor R_REF, from the reference source line SLS.

Figure 11:
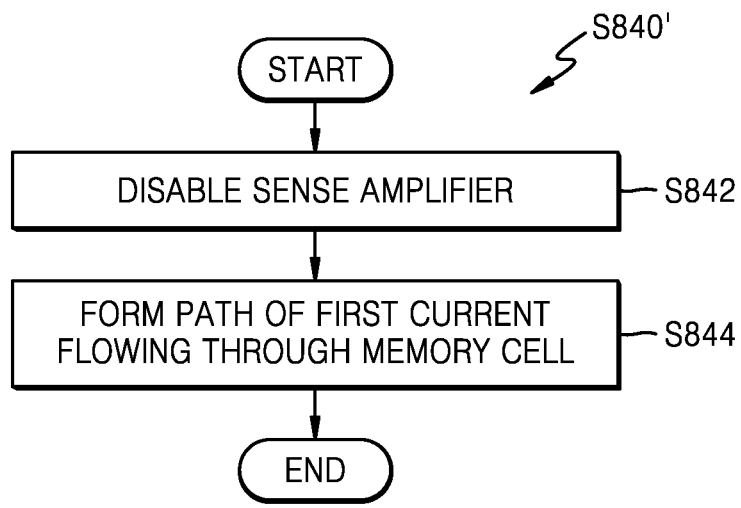
FIG. 11 is a flowchart of an operating method of a memory device, according to an exemplary embodiment.

FIG. 11 is a flowchart of an operating method of a memory device, according to an exemplary embodiment. Specifically, the flowchart of FIG. 11 shows an example of operation S840 of FIG. 2. As described above with reference to FIG. 2, an operation of programming a memory cell may be performed in operation S840' of FIG. 11. Further, as shown in FIG. 11, operation S840' may include operations S842 and S844. In some embodiments, operation S840' may be performed by the memory device 10 of FIG. 1, and hereinafter, FIG. 11 is described below with reference to FIGS. 1 and 2.

Referring to FIG. 11, in operation S842, an operation of disabling the sense amplifier 15 may be performed. For example, the controller 17 may provide an inactivated control signal, e.g., the inactivated sense enable signal SE and amplification enable signal AE, to the sense amplifier 15. Accordingly, the sense amplifier 15 may not sense a difference between the first current I1 and the second current I2, and the first current I1 and the second current I2 may be supplied from or drained to the sense amplifier 15.

In operation S844, an operation of forming a path of the first current I1 flowing through the memory cell may be performed. For example, the controller 17 may provide an activated control signal, e.g., the activated write enable signal WE, to the switch network 13, and the switch network 13 may form a path of the first current I1 flowing through the memory cell according to the input data DI in response to or based on the activated write enable signal WE. Accordingly, the memory cell may be programmed according to the input data DI. In some embodiments, the switch network 13 may not form a path of a current flowing through a reference cell, i.e., the second current I2, in operation S840'.

Figure 12:
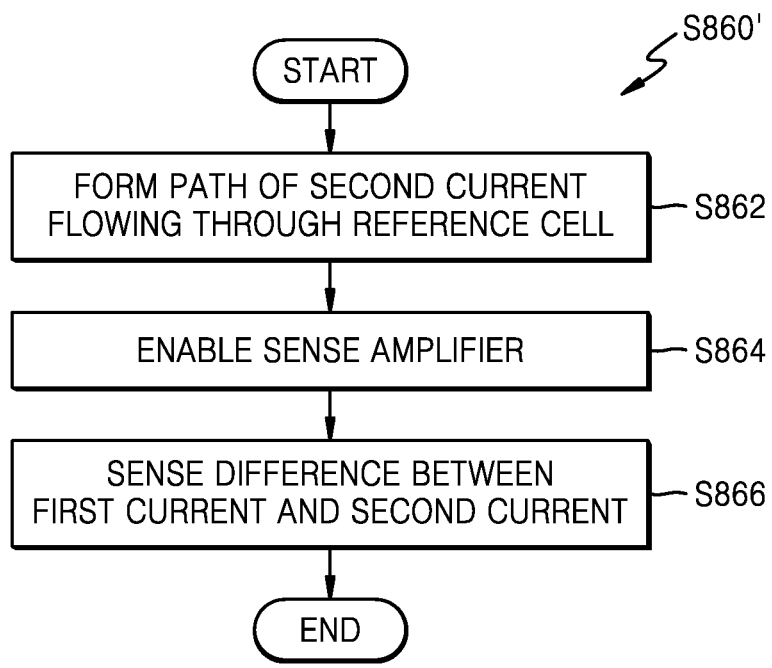
FIG. 12 is a flowchart of an operating method of a memory device, according to an exemplary embodiment.

FIG. 12 is a flowchart of an operating method of a memory device, according to an exemplary embodiment. Specifically, the flowchart of FIG. 12 shows an example of operation S860 of FIG. 2. As described above with reference to FIG. 2, an operation of verifying a memory cell may be performed in operation S860' of FIG. 12. Further, as shown in FIG. 12, operation S860' may include a plurality of operations S862, S864, and S866. In some embodiments, operation S860' may be performed by the memory device 10 of FIG. 1, and hereinafter, FIG. 12 is described with reference to FIGS. 1 and 2.

Referring to FIG. 12, in operation S862, an operation of forming a path of the second current I2 flowing through a reference cell may be performed. For example, in operation S860', the controller 17 may generate the activated sense enable signal SE and provide the activated sense enable signal SE to the switch network 13. The switch network 13 may form a path of the second current I2 flowing through the reference cell according to the input data DI in response to or based on the activated sense enable signal SE, and the path of the second current I2 may correspond to a path of the first current I1.

In operation S864, an operation of enabling the sense amplifier 15 may be performed. For example, the controller 17 may provide an activated control signal, e.g., the activated sense enable signal SE and amplification enable signal AE, to the sense amplifier 15. An example of operation S864 is described below with reference to FIG. 13.

In operation S866, an operation of sensing a difference between the first current I1 and the second current I2 may be performed. For example, the sense amplifier 15 enabled in operation S864 may sense the difference between the first current I1 and the second current I2, generate the output data DO according to the sense result, and provide the output data DO to the data buffer 16. An example of operation S866 is described below with reference to FIG. 14.

Figure 13:
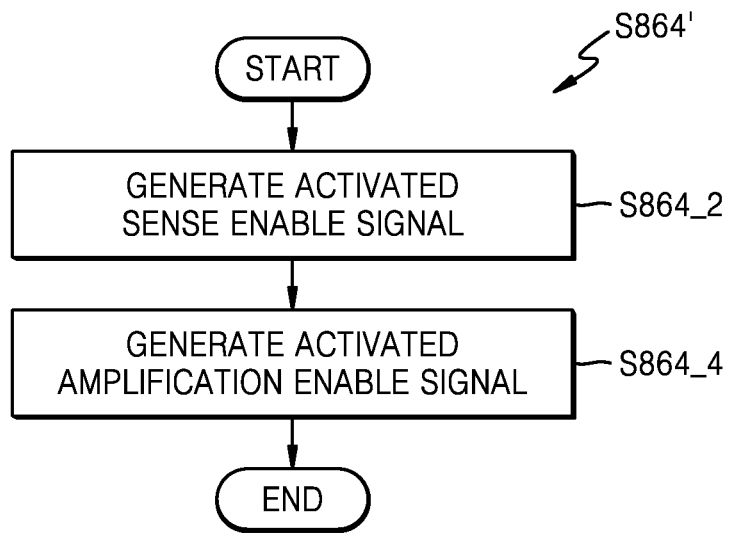
FIG. 13 is a flowchart of an operating method of a memory device, according to an exemplary embodiment.

FIG. 13 is a flowchart of an operating method of a memory device, according to an exemplary embodiment. Specifically, the flowchart of FIG. 13 shows an example of operation S864 of FIG. 12. As described above with reference to FIG. 12, in operation S864' of FIG. 13, an operation of enabling the sense amplifier may be performed. Further, as shown in FIG. 13, operation S864' may include operations S864_2 and S864_4. In some embodiments, operation S864' may be performed by the controller 17 of FIG. 1, and hereinafter, FIG. 13 is described with reference to FIG. 4.

Referring to FIG. 13, in operation S864_2, an operation of generating the activated sense enable signal SE may be performed. In some embodiments, the controller 17 may activate the sense enable signal SE after a certain time elapses from a time point (i.e., the time t41) at which a program interval $T_{PG}$ starts, and accordingly, the program interval $T_{PG}$ may end, and a verify interval $T_{VF}$ may start. In some embodiments, the controller 17 may activate the sense enable signal SE based on a change in a magnitude of the first current I1 provided to a memory cell in the program interval $T_{PG}$, and accordingly, the program interval $T_{PG}$ may end, and the verify interval $T_{VF}$ may start.

In operation S864_4, an operation of generating the activated amplification enable signal AE may be performed. For example, the controller 17 may generate the amplification enable signal AE by delaying the sense enable signal SE, and accordingly, the amplification enable signal AE may be activated after a certain time elapses from a time point at which the sense enable signal SE is activated. The delay between the sense enable signal SE and the amplification enable signal AE may be determined based on a development speed of the first current I1 and the second current I2. The first current I1 and the second current I2 may have a larger magnitude during a verify operation than during a read operation, and accordingly, the development of the first current I1 and the second current I2 may be faster during the verify operation than during the read operation. Thus, in some embodiments, the controller 17 may reduce the delay between the sense enable signal SE and the amplification enable signal AE more during the verify operation than during the read operation. In some embodiments, as described above with reference to FIGS. 4 and 6, the controller 17 may generate the activated amplification enable signal AE by delaying the activated sense enable signal SE and may inactivate both the sense enable signal SE and the amplification enable signal AE.

Figure 14:
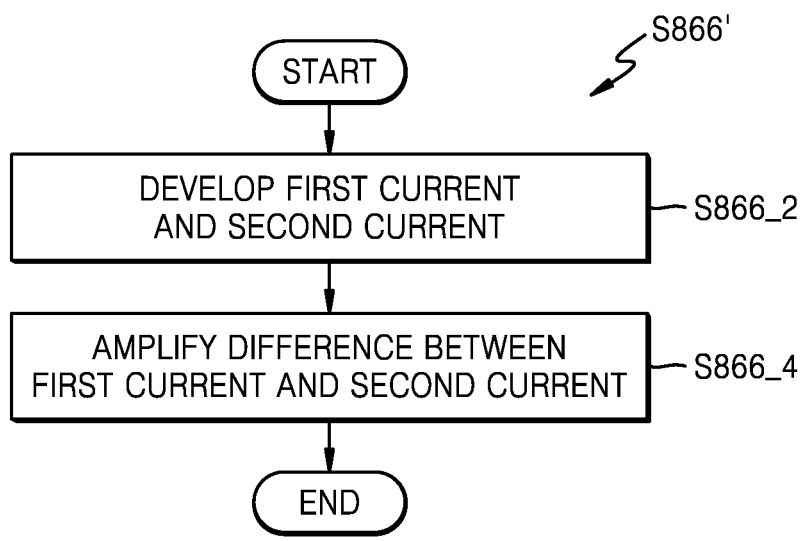
FIG. 14 is a flowchart of an operating method of a memory device, according to an exemplary embodiment.

FIG. 14 is a flowchart of an operating method of a memory device, according to an exemplary embodiment. Specifically, the flowchart of FIG. 14 shows an example of operation S866 of FIG. 12. As described above with reference to FIG. 12, in operation S866' of FIG. 14, an operation of sensing a difference between the first current I1 and the second current I2 may be performed. Further, as shown in FIG. 14, operation S866' may include operations S866_2 and S866_4. In some embodiments, operation S866' may be performed by the sense amplifier 15 of FIG. 1, and hereinafter, FIG. 14 is described with reference to FIGS. 3 and 13.

Referring to FIG. 14, in operation S866_2, an operation of developing the first current I1 and the second current I2 may be performed. For example, the sense amplifier 15 may develop the first current I1 and the second current I2 in response to or based on the sense enable signal SE activated in operation S864_2. Accordingly, based on a difference between the resistance of the variable resistance element MTJ and the resistance of the reference resistor R_REF, the first current I1 and the second current I2 may be differently developed, thereby causing a difference between the first current I1 and the second current I2.

In operation S866_4, an operation of amplifying the difference between the first current I1 and the second current I2 may be performed. For example, the sense amplifier 15 may amplify the difference between the first current I1 and the second current I2 in response to or based on the amplification enable signal AE activated in operation S864_4. Accordingly, the sense amplifier 15 may output the output data DO corresponding to data stored in a memory cell.

Figure 15:
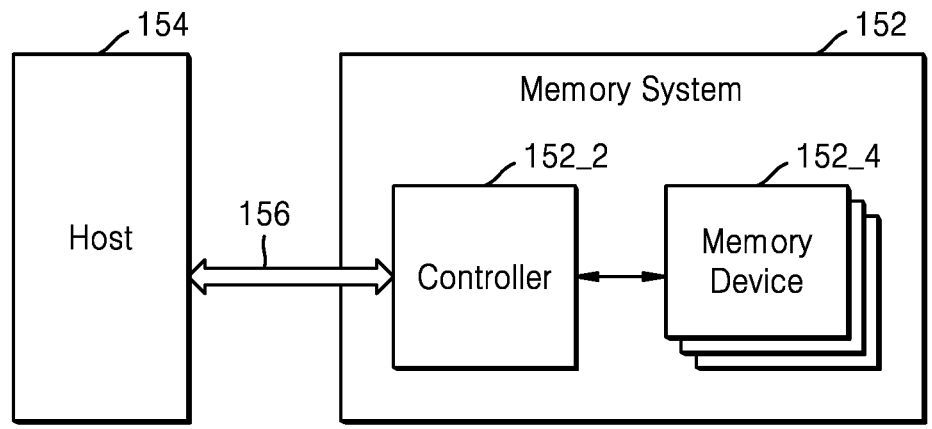
FIG. 15 is a block diagram of a memory system including a memory device, according to an exemplary embodiment.

FIG. 15 is a block diagram of a memory system 152 including a memory device, according to an exemplary embodiment. As shown in FIG. 15, the memory system 152 may communicate with a host 154 and include a controller 152_2 and a memory device 152_4.

An interface 156 through which the memory system 152 communicates with the host 154 may use an electrical signal and/or an optical signal in a wired or wireless manner, and as a non-limited example, the interface 156 may be implemented by a serial advanced technology attachment (SATA) interface, a SATA express (SATAe) interface, a serial attached small computer system interface (serial attached SCSI (SAS)), a peripheral component interconnect express (PCIe) interface, a non-volatile memory express (NVMe) interface, an advanced host controller interface (AHCI), or a combination thereof.

In some embodiments, the memory system 152 may communicate with the host 154 by removably coupling to the host 154. The memory device 152_4 as a resistive memory may be a nonvolatile memory, and the memory system 152 may be referred to as a storage system. For example, the memory system 152 may be implemented by, as a non-limiting example, a solid-state drive or solid-state disk (SSD), an embedded SSD (eSSD), a multimedia card (MMC), an embedded multimedia card (eMMC), or the like.

The controller 152_2 may control the memory device 152_4 in response to a request received from the host 154 through the interface 156. For example, the controller 152_2 may write data received together with a write request in the memory device 152_4 in response to the write request and provide data stored in the memory device 152_4 to the host 154 in response to a read request.

The memory system 152 may include at least one memory device 152_4, and the memory device 152_4 may include a memory cell, having a variable resistance element, and a reference cell. As described above with reference to the drawings, the memory device 152_4 may efficiently perform a verify operation included in a write operation, and accordingly, the reliability of the write operation and a write speed may be improved. As a result, both the operation reliability and the performance of the memory system 152 may be improved.

Figure 16:
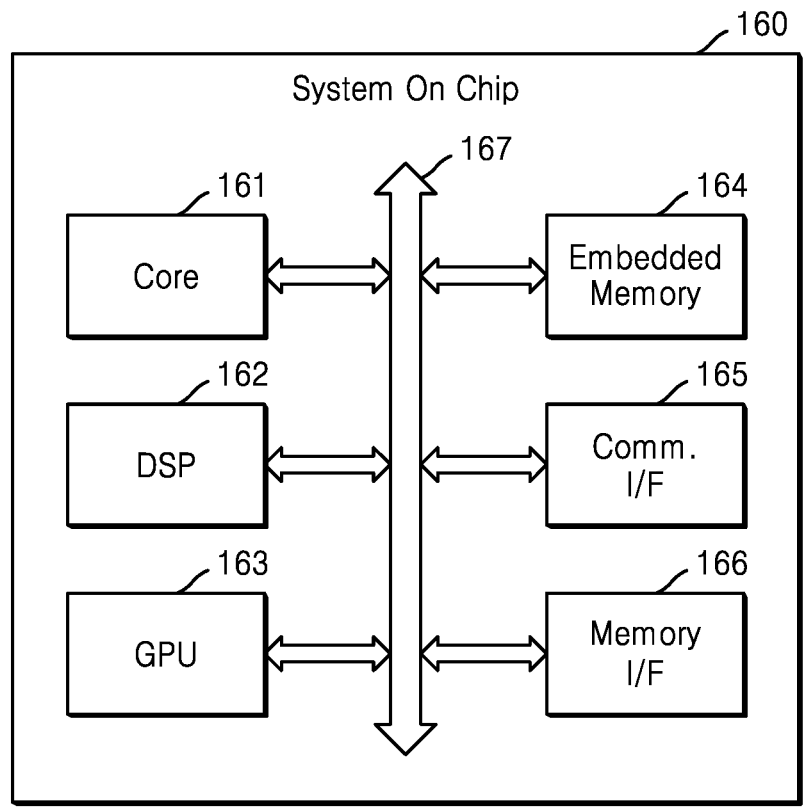
FIG. 16 is a block diagram of a system on chip including a memory device, according to an exemplary embodiment.

FIG. 16 is a block diagram of a system on chip (SoC) 160 including a memory device, according to an exemplary embodiment. The SoC 160 may indicate an integrated circuit in which a computing system and components of another electronic system are integrated. As an example of the SoC 160, an application processor (AP) may include a processor and components for other functions. As shown in FIG. 16, the SoC 160 may include a core 161, a digital signal processor (DSP) 162, a graphics processing unit (GPU) 163, an embedded memory 164, a communication interface 165, and a memory interface 166. The components of the SoC 160 may communicate with each other through a bus 167.

The core 161 may process instructions and control an operation of the components included in the SoC 160. For example, the core 161 may process a series of instructions to drive an operating system and execute applications on the operating system. The DSP 162 may generate useful data by processing a digital signal, e.g., a digital signal provided from the communication interface 165. The GPU 163 may generate data for an image to be output through a display device from image data provided from the embedded memory 164 or the memory interface 166 and encode the image data. The communication interface 165 may provide an interface for a communication network or one-to-one communication. The memory interface 166 may provide an interface for an external memory of the SoC 160, e.g., dynamic random access memory (DRAM), flash memory, or the like.

The embedded memory 164 may store data to operate (e.g., required to operate) the core 161, the DSP 162, and the GPU 163. The embedded memory 164 may include a resistive memory according to an exemplary embodiment, and accordingly, the embedded memory 164 may provide a high write reliability and write speed, and as a result, the operation reliability and performance of the SoC 160 may be improved.

While exemplary embodiments have been particularly shown and described above, it will be understood that various changes in form and details may be made therein without departing from the spirit and scope of at least the following claims.

What is claimed is:

1. A memory device comprising:
a cell array comprising a memory cell and a reference cell;
a sense amplifier configured to sense a difference between a first current flowing through the memory cell and a second current flowing through the reference cell, based on an activated sense enable signal;
a controller configured to inactivate the sense enable signal in a program interval and activate the sense enable signal in a verify interval subsequent to the program interval, during a write operation;
a voltage driver configured to provide a write voltage to the memory cell in the program interval and the verify interval during the write operation, and to provide a read voltage to the memory cell during a read operation; and
a row decoder connected to the cell array through a plurality of word lines,
wherein the row decoder is configured to activate a word line connected to the memory cell and the reference cell in the program interval and the verify interval.

2. The memory device of claim 1, wherein:
the controller is further configured to activate the sense enable signal during the read operation; and
the first current and the second current have a larger magnitude during the write operation than during the read operation.

3. The memory device of claim 1, wherein the controller is further configured to inactivate the sense enable signal based on the verify interval ending.

4. The memory device of claim 1, wherein:
the controller is further configured to generate an amplification enable signal by delaying the sense enable signal; and
the sense amplifier is further configured to amplify a difference between the first current and the second current based on an activated amplification enable signal.

5. The memory device of claim 4, wherein the sense amplifier comprises:
a first inverter and a second inverter cross-coupled between a sense node through which the first current flows and a reference node through which the second current flows;
a first transistor and a second transistor configured to provide the first current and the second current to the sense node and the reference node, respectively, based on the activated sense enable signal; and
a third transistor configured to allow a power supply current to flow through the first inverter and the second inverter based on the amplification enable signal.

6. The memory device of claim 1, further comprising:
a reference resistor connected to a plurality of reference cells of the cell array,
wherein the memory cell comprises:
a memory cell transistor connected to the word line; and
a variable resistance element connected in series to the memory cell transistor, and
wherein the reference cell comprises a reference cell transistor connected to the word line and electrically connected to the reference resistor.

7. The memory device of claim 1, wherein the voltage driver is further configured to provide the write voltage to the reference cell in the verify interval and provide the read voltage to the reference cell during the read operation.

8. The memory device of claim 1, further comprising:
a switch network configured to set a path of a third current flowing through the memory cell according to data to be written in the memory cell,
wherein the first current and the third current flow through a same path by the switch network.

9. The memory device of claim 8, wherein the switch network is further configured to block a current flowing through the reference cell in the program interval and set a path of a fourth current flowing through the reference cell according to data to be written in the memory cell in the verify interval.

10. The memory device of claim 9, wherein:
the switch network comprises:
a plurality of first switches configured to form the path of the third current; and
a plurality of second switches configured to form the path of the fourth current,
wherein a first switch and a second switch corresponding to each other among the plurality of first switches and the plurality of second switches have a same structure.

11. The memory device of claim 10, wherein the plurality of second switches comprise at least one second switch controlled by the sense enable signal.

12. A method of writing data in a cell array comprising a memory cell and a reference cell, the method comprising:
providing a write voltage to the memory cell;
programming the memory cell in a program interval; and
verifying the memory cell in a verify interval subsequent to the program interval,
wherein the programming comprises disabling a sense amplifier, and
wherein the verifying comprises:
providing the write voltage to the memory cell and the reference cell;
enabling the sense amplifier; and
sensing, by the enabled sense amplifier, a difference between a first current flowing through the memory cell and a second current flowing through the reference cell.

13. The method of claim 12, further comprising:
reading data stored in the memory cell,
wherein the reading the data comprises:
providing a read voltage to the memory cell and the reference cell;
enabling the sense amplifier; and
sensing, by the enabled sense amplifier, a third current flowing through the memory cell and a fourth current flowing through the reference cell,
wherein the first current is greater than the third current, and
wherein the second current is greater than the fourth current.

14. The method of claim 12, wherein:
the programming further comprises setting a path of a fifth current flowing through the memory cell according to data to be written in the memory cell; and
the first current and the fifth current flow through a same path.

15. The method of claim 12, wherein the verifying further comprises setting a path of a current flowing through the reference cell according to the data to be written in the memory cell.

16. The method of claim 12, wherein:
the enabling the sense amplifier comprises:
generating an activated sense enable signal; and
generating an activated amplification enable signal by delaying the sense enable signal, and
wherein the sensing the difference between the first current and the second current comprises:
developing the first current and the second current based on the activated sense enable signal; and
amplifying the difference between the first current and the second current based on the activated amplification enable signal.

17. The method of claim 12, wherein:
the memory cell comprises a memory cell transistor and a variable resistance element connected in series to each other; and
the reference cell comprises a reference cell transistor and is electrically connected to a reference resistor outside the cell array.

18. A memory device comprising:
a cell array comprising a memory cell and a reference cell;
a sense amplifier configured to supply a current to the memory cell and the reference cell and sense a difference between a first current flowing through the memory cell and a second current flowing through the reference cell;
a voltage driver configured to provide a write voltage to the memory cell during a write operation and to provide a read voltage to the memory cell during a read operation; and
a controller configured to control the sense amplifier to sense the difference between the first current and the second current while providing the write voltage to the memory cell, to verify a programmed memory cell during the write operation,
wherein the write voltage is higher than the read voltage, and
wherein the controller is further configured to control the sense amplifier to sense the difference between the first current and the second current while providing the read voltage to the memory cell during the read operation.

* * * * *